(12) United States Patent
Hoshuyama

(10) Patent No.: US 8,040,944 B2
(45) Date of Patent: Oct. 18, 2011

(54) ADAPTIVE DIGITAL FILTER, SIGNAL PROCESSING METHOD, FM RECEIVER, AND PROGRAM

(75) Inventor: Osamu Hoshuyama, Tokyo (JP)

(73) Assignee: NEC Corporation, Tokyo (JP)

( * ) Notice: Subject to any disclaimer, the term of this patent is extended or adjusted under 35 U.S.C. 154(b) by 929 days.

(21) Appl. No.: 11/988,735

(22) PCT Filed: Jun. 30, 2006

(86) PCT No.: PCT/JP2006/313052
§ 371 (c)(1),
(2), (4) Date: Jan. 14, 2008

(87) PCT Pub. No.: WO2007/010727
PCT Pub. Date: Jan. 25, 2007

(65) Prior Publication Data
US 2009/0122932 A1 May 14, 2009

(30) Foreign Application Priority Data
Jul. 15, 2005 (JP) .................. 2005-206720

(51) Int. Cl.
H03H 7/30 (2006.01)
H03H 7/40 (2006.01)
H03K 5/159 (2006.01)
(52) U.S. Cl. ........ 375/232; 375/350; 375/347; 375/324; 375/233; 375/346; 455/138; 455/139; 455/304
(58) Field of Classification Search .................. 375/350, 375/347, 324, 232, 233, 346
See application file for complete search history.

(56) References Cited

U.S. PATENT DOCUMENTS

| 4,797,950 | A | * | 1/1989 | Rilling | 455/276.1 |
| 5,146,470 | A | * | 9/1992 | Fujii et al. | 375/350 |
| 5,867,486 | A | * | 2/1999 | Sugiyama | 370/290 |
| 6,021,161 | A | * | 2/2000 | Yamaguchi et al. | 375/232 |
| 6,396,872 | B1 | * | 5/2002 | Sugiyama | 375/232 |

(Continued)

FOREIGN PATENT DOCUMENTS
JP 08-056245 2/1996
(Continued)

OTHER PUBLICATIONS

C.R. Johnson et al., "Blind Equalization Using the Constant Modulus Criterion: A Review," Proceedings of the IEEE, vol. 86:10, Oct. 1998, pp. 1927-1950.

(Continued)

Primary Examiner — Shuwang Liu
Assistant Examiner — Sung Ahn
(74) Attorney, Agent, or Firm — Foley & Lardner LLP

(57) ABSTRACT

A complex signal in which one of two signals that are generated from one real signal and that have phases shifted from each other by 90° is a real part and the other signal is an imaginary part is applied as input to an input terminal. A filter unit generates an output signal that is a complex signal by means of a convolution operation of this input signal and filter coefficients that are real signals and supplies the result to an output terminal. A coefficient control unit composed of a common unit and separate units controls the envelope target value based on the input signal and updates the filter coefficients such that the value of the envelope derived from the output signal approaches the envelope target value.

9 Claims, 13 Drawing Sheets

U.S. PATENT DOCUMENTS

| | | |
|---|---|---|
| 6,418,228 B1 * | 7/2002 | Terai et al. .................. 381/71.8 |
| 6,621,863 B1 | 9/2003 | Ido |
| 7,155,245 B2 | 12/2006 | Yamamoto et al. |
| 2001/0016004 A1 * | 8/2001 | Kim ............................. 375/233 |
| 2003/0058976 A1 * | 3/2003 | Ohta et al. ................... 375/350 |
| 2005/0053177 A1 * | 3/2005 | Yamamoto et al. .......... 375/350 |
| 2005/0123035 A1 | 6/2005 | Yamamoto et al. |

FOREIGN PATENT DOCUMENTS

| | | |
|---|---|---|
| JP | 09-162783 | 6/1997 |
| JP | 2000-286763 A | 10/2000 |
| JP | 2003-248673 A | 9/2003 |
| JP | 2005-064618 A | 3/2005 |
| JP | 2005-167717 A | 6/2005 |

OTHER PUBLICATIONS

J.R. Treichler et al., "A New Approach to Multipath Correction of Constant Modulus Signals," IEEE Transaction on Acoustics, Speech, and Signal Processing, vol. ASSP-31, No. 2, Apr. 1983, pp. 459-472.

* cited by examiner

ADAPTIVE DIGITAL FILTER, SIGNAL PROCESSING METHOD, FM RECEIVER, AND PROGRAM

This application is the National Phase of PCT/JP2006/313052, filed Jun. 30, 2006, which claims priority to Japanese Application No. 2005-206720, filed Jul. 15, 2005, the disclosures of which are hereby incorporated by reference in their entirety.

TECHNICAL FIELD

The present invention relates to an adaptive digital filter, and more particularly to an adaptive digital filter suitable for the multipath equalizer of an FM (Frequency Modulation) receiver.

BACKGROUND ART

FM modulated waves that are widely used in FM radio broadcasting and television broadcasting are signals in which a sine-wave carrier signal is subjected to phase modulation by a music signal. FM modulated waves have high resistance against noise and can transmit music signals having a wide band of 15 kHz with a low distortion factor. However, in multipath propagation paths that include, in addition to paths by which radio waves arrive directly, paths by which radio waves arrive with a delay due to reflection by obstructions such as buildings, the influence of strong reflected waves received together with direct waves disturbs the phase information required for demodulation, and distortion therefore occurs in the demodulated signal. This distortion that is produced as a result of multipath propagation paths is referred to as "multipath distortion." An equalizer for reducing multipath distortion by compensating for the characteristics of the multipath propagation paths is referred to as a "multipath equalizer" or a "multipath distortion canceller."

A multipath equalizer reduces the influence of multipaths in the received signal by passing the received signal through a filter having the inverse characteristics of the multipath propagation paths, i.e., an inverse filter. The characteristics of the multipath propagation paths change according to the environment, and the characteristics of the inverse filter must therefore be optimized according to conditions over time. As a result, adaptive digital filters are typically used for inverse filters.

An adaptive digital filter is a filter having a capability for automatically updating filter coefficients according to changes in the environment. An algorithm for calculating filter coefficients at each point in time is referred to as an "adaptive algorithm," an LMS (Least Mean Square) algorithm being a representative example. In a broad sense, an LMS algorithm is a method of minimizing the mean-square error based on a steepest-descent method and offers the advantages of stability and a small amount of operations. An adaptive algorithm known as a "complex LMS algorithm" is also known. A complex LMS algorithm is an expansion of the LMS algorithm for cases in which each of the input signal, output signal, target signal, and filter coefficients are complex amounts, and such an algorithm is used, for example, when the input is a narrow-band high-frequency signal and adaptation is realized by separating the in-phase component and quadrature component of the input signal.

A conventional equalizer that is realized through the use of an adaptive digital filter requires a reference signal (training signal) for adaptation, and this requirement tends to bring about a reduction of communication efficiency due to interruptions in communication and the effect of redundant reference signals. In contrast, an equalizer known as a "blind equalizer" that has been developed in recent years performs restorative equalization of signals based only on the received signals without requiring a reference signal for adaptation. Algorithms suitable for such blind equalization are referred to as "blind algorithms," a CMA (Constant Modulus Algorithm) being a representative example.

As disclosed in the document C. Richard Johnson, Jr., Philip Schniter, Thomas J. Endres, James D. Behm, Donald R. Brown, and Raúl A. Casas, "Blind Equalization Using the Constant Modulus Criterion: A Review" (Proceedings of IEEE, Vol. 86, No. 10, October 1998), CMA typically refers to an algorithm that takes as an index a statistic relating to the output signal such as the envelope of the filter output or a higher-order statistic and that updates filter coefficients such that this index approaches a target value. As disclosed in the document: J. R. Treichler and B. G. Agee, "A New Approach to Multipath Correction of Constant Modulus Signals" (IEEE Transactions on Acoustics, Speech, and Signal Processing, Vol. 31, No. 2, pp. 459-472, April 1983), when using a constant-amplitude modulated wave in which the amplitude of the modulated wave is fixed, as in FM modulation, the envelope of the filter output, i.e., the amplitude, is used as the index, and the filter coefficients are updated to minimize the error between a target value and the value of the envelope of the signal following passage through the filter. In this way, distortion of phase is corrected together with the correction of distortion of the envelope, and the influence of the reflected waves of multipath propagation paths is eliminated. Here, CMA is a different concept than an adaptive algorithm. In CMA, an adaptive algorithm such as the previously mentioned LMS algorithm is used as an adaptive algorithm for calculating filter coefficients at each time point. In order to control the value of the envelope of the output signal of a filter to a uniform value as described above, the value of the envelope must be extracted instantaneously, and complex signal processing is one representative method. In complex signal processing, a real signal f2 having phase that is delayed 90° ($\pi/2$) with respect to a particular real signal f1 is generated by, for example, a Hilbert transformer, whereby a complex signal (typically referred to as an "analytic signal") having f1 as a real part and f2 as an imaginary part is generated. Thus, the value of the envelope of this real signal can be found instantaneously by calculating the square sum of the real part and imaginary part of the complex signal. However, when the output signal of the filter is subjected to complex signal processing, delay caused by the complex signal processing in the coefficient updating loop gives rise to instability of the loop, and complex signal processing is therefore preferably carried out upon the input signal. In this case, the input signal becomes a complex signal, and an algorithm that can handle complex quantities such as a complex LMS algorithm is therefore used as the adaptive algorithm. This method is hereinbelow referred to as the "first technique of the related art."

FIG. 1 shows the configuration of an adaptive digital filter that uses the first technique of the related art. Input signal X(k) is a complex signal realized by a Hilbert transformer (not shown). Complex filter coefficient vector W(k) are convoluted with this complex signal as input to obtain output signal y(k), which is a complex signal. Complex filter coefficient vector W(k) are updated by an adaptive algorithm that has been expanded to handle complex signals such that the value of the envelope of output signal y(k) approaches a target value that has been prescribed in advance. The algorithm of this adaptive digital filter is represented as shown below:

$$W(k+1)=W(k)-\mu(|y(k)|^p-yref0)^q y(k) X^H(k) \quad (1)$$

$$y(k)=W^T(k)X(k) \quad (2)$$

$$W(k)=[w_0(k),w_1(k),\ldots,w_{N-1}(k)]^T \quad (3)$$

$$X(k)=[x(k),x(k-1),\ldots,x(k-N+1)]^T \quad (4)$$

where W(k) represents a filter coefficient vector, X(k) represents a complex signal vector, k represents a sample index, N represents the number of filter taps, y(k) represents the output signal, yref0 represents the envelope target value, and μ represents a parameter for determining the amount of update of the filter coefficients. In addition, H represents a complex conjugate transposition, and T represents a transposition. The values p and q are constants for determining an evaluation function of error with respect to the envelope target value, and for example, may be p=1 and q=1.

In the first technique of the related art, two signals having phases shifted 90° (π/2) with respect to each other are generated by applying complex signal processing. However, as can be seen from the patent document JP-A-2005-064618 and the document "Hardware Implementation of FM Multipath Distortion Canceller" by Itami Makoto, Hatori Mitsutoshi, and Tsukamoto Norio (National Convention Record of the Institute of Television Engineers of Japan, pp. 355-356, 1986), if sampling is carried out at a frequency of (4/odd number) times the carrier frequency when sampling the input signal, the phases of adjacent sample points will be shifted 90°. By taking this approach, an adaptive algorithm for handling real numbers can be used as is, and the square sum of adjacent sample points can be calculated when seeking the value of the envelope of the output. This method is hereinbelow referred to as the "second technique of the related art."

FIG. 2 shows the configuration of an adaptive digital filter that uses the second technique of the related art. Input signal Xr(k) is a real signal, and real-signal filter coefficient vector Wr(k) are convoluted with this real signal as input to obtain output signal yr(k) that is a real signal. Filter coefficient vector Wr(k) are updated by an adaptive algorithm that handles real coefficients such that the envelope of output signal yr(k) approaches a target value that has been prescribed in advance. The algorithm of this adaptive digital filter is represented as shown below:

$$Wr(k+1)=Wr(k)=\mu(Env[yr(k)]-yref0)yr(k)Xr(k) \quad (5)$$

$$yr(k)=Wr^T(k)Xr(k) \quad (6)$$

$$Env[yr(k)]=(yr^2(k-1)+yr^2(k))^{1/2} \quad (7)$$

$$Wr(k)=Re[W(k)] \quad (8)$$

$$Xr(k)=Re[X(k)] \quad (9)$$

where Wr(k) represents a real coefficient vector, Xr(k) represents a real signal vector, Env[ ] represents an operation for obtaining an approximate value of the envelope, Re[ ] represents an operation for extracting the real part of the complex number, and yr(k) represents a real-number output signal. The envelope target value yref0 is basically a constant, but in JP-A-2005-064618, the envelope target value is variably set according to the amplitude of the input signal of the adaptive digital filter to eliminate the influence of Doppler fading contained in a received wave and thus stabilize the adaptive process. More specifically, the input amplitude signal is found by calculating the square sum of adjacent sample points in the input signal, and a signal obtained by passing this input amplitude signal through an LPF (Low-Pass Filter) is then taken as the envelope target value.

The problem of the above-described adaptive digital filter of the related art is the requirement for a large amount of operations and large-scale hardware. The reasons for these problems are as described below.

A first reason is the extremely broad range of fluctuation of filter coefficients. For example, when the envelope target value is "1" and the input signal amplitude is "1," the filter coefficient have a value on the order of "1," but when the input signal amplitude is "0.01," the filter coefficient have a value on the order of "100." In order to accurately express filter coefficients having this broad range of fluctuation without causing overflow, highly accurate operations are required in filter coefficients operation in which filter coefficients are represented by floating points or, in the case of a fixed point, in which the number of bits is increased. However, high-accuracy operations entail a large amount of operation and increase the scale of hardware.

A second reason is the complex signal processing. In other words, in the adaptive digital filter shown in FIG. 1, almost all signal processing for input signal X(k), filter coefficient vector W(k), and output signal y(k) is carried out by complex numbers. One multiplication between complex numbers is equivalent to four multiplications and two additions of real numbers. In a multipath equalizer for an FM receiver, the convolution operations and coefficients updating operations of a filter having a large number of taps must be carried out for each short sampling cycle, and the amount of operations is therefore voluminous. In the adaptive digital filter shown in FIG. 2, the calculation accuracy of the envelope will be high, performance equivalent to the adaptive digital filter shown in FIG. 1 will be obtained, and the amount of operations can be cut to approximately 25% if the sampling frequency is a precise multiple of (4/odd number) as seen from the center frequency of an intermediate frequency signal. However, severe limitations are placed on the sampling frequency, and this raises the different problem of preventing freedom of design for any sampling frequency. When the sampling frequency diverges from a multiple of (4/odd number) of the center frequency of the intermediate frequency signal, the calculation accuracy of the envelope drops and the performance of the multipath equalizing itself deteriorates.

DISCLOSURE OF THE INVENTION

The present invention was proposed in view of this situation and therefore has as its object the provision of an adaptive digital filter that can achieve a reduction of the amount of operations.

It is another object of the present invention to provide an adaptive digital filter in which no limitations are placed on the sampling frequency.

The first adaptive digital filter of the present invention is provided with: a filter unit for generating an output signal by means of a convolution operation of an input signal and filter coefficients and supplying the result as output; and a coefficients control unit for controlling the filter coefficients based on error between a target signal and an index value derived from the output signal, and further, for controlling the target signal based on at least one of the input signal and output signal to suppress the range of fluctuation of the filter coefficients. The second adaptive digital filter of the present invention is provided with a filter unit for taking as an input signal a complex signal in which one of two signals that are generated from one real signal and that have phases shifted 90° from each other is a real part and the other signal is an imaginary part, generating an output signal that is a complex signal by means of a convolution operation of the input signal and filter coefficients that are real signals, and supplying the result as output; and a coefficients control unit for controlling the filter coefficients based on error between a target signal and an index value derived from the output signal, and further, for controlling the target signal based on at least one of the input signal and the output signal.

The third adaptive digital filter of the present invention is provided with a filter unit for generating an output signal by means of a convolution operation of an input signal and filter coefficients and supplying the result as output; and a coefficients control unit for controlling the filter coefficients based on error between a target signal and an index value derived from the output signal, and further, for controlling the target signal such that the target signal is substantially proportional to the amplitude of the input signal to suppress the range of fluctuation of the filter coefficients.

The fourth adaptive digital filter of the present invention is provided with a filter unit for taking as an input signal a complex signal in which one of two signals that are generated from one real signal and that have phases shifted 90° from each other is a real part and the other signal is an imaginary part, generating an output signal that is a complex signal by means of a convolution operation of the input signal and filter coefficients that are real signals, and supplying the result as output; and a coefficients control unit for controlling the filter coefficients based on error between a target signal and an index value derived from the output signal, and further, for controlling the target signal such that the target signal is substantially proportional to the amplitude of the input signal.

The fifth adaptive digital filter of the present invention is an adaptive digital filter according to any one of the first to fourth adaptive digital filters in which the coefficients control unit, when implementing control of the target signal based on the amplitude of the input signal, decreases the target signal when the amplitude of the input signal is decreasing, increases the target signal when the amplitude of the input signal is increasing, and further, makes the speed of decreasing the target signal greater than the speed of increasing the target signal.

The sixth adaptive digital filter of the present invention is an adaptive digital filter according to any one of the first to fourth adaptive digital filters in which the coefficients control unit, when implementing control of the target signal based on the amplitude of the output signal, decreases the target signal when the amplitude of the output signal is increasing, increases the target signal when the amplitude of the output signal is decreasing, and makes the speed of decreasing the target signal greater than the speed of increasing the target signal.

The seventh adaptive digital filter of the present invention is an adaptive digital filter according to any one of the first to sixth adaptive digital filters in which the coefficients control unit makes the value of the envelope of the output signal the index value.

The eighth adaptive digital filter of the present invention is an adaptive digital filter according to the seventh adaptive digital filter in which the coefficients control unit is provided with: a common unit for controlling the target signal, generating a signal according to error between the target signal and the value of the envelope of the output signal, and supplying the result as output; and a plurality of separate units provided for each multiplier for the convolution operations in the filter unit for calculating filter coefficients to be used in a next sampling cycle based on: the signal applied as input to a corresponding multiplier, the signal received as input from the common unit, and the current filter coefficients.

The ninth adaptive digital filter of the present invention is an adaptive digital filter according to any one of the first to eighth adaptive digital filters in which the coefficients control unit controls an index value derived from the output signal instead of controlling the target signal.

The FM receiver of the present invention is an FM receiver that uses any one of the first to ninth adaptive digital filters and that is provided with a Hilbert transformer for applying as input to the adaptive digital filter a complex signal that is generated by subjecting an FM modulated signal, which has been converted to an intermediate frequency and digitized, to a Hilbert transform.

The first signal processing method of the present invention includes: a first step of generating an output signal by a convolution operation of an input signal and filter coefficients and supplying the result as output; and a second step of controlling the filter coefficients based on error between a target signal and an index value derived from the output signal, and further, for controlling the target signal based on at least one of the input signal and the output signal to suppress the range of fluctuation of the filter coefficients.

The second signal processing method of the present invention includes: a first step of taking as an input signal a complex signal in which one of two signals that are generated from one real signal and that have phases shifted 90° from each other is a real part and the other signal is an imaginary part, generating an output signal that is a complex signal by means of a convolution operation of the input signal and filter coefficients that are real signals, and supplying the result as output; and a second step of controlling the filter coefficients based on error between a target signal and an index value derived from the output signal, and further, of controlling the target signal based on at least one of the input signal and the output signal.

The third signal processing method of the present invention includes: a first step of generating an output signal by means of a convolution operation of an input signal and filter coefficients and supplying the result as output; and a second step of controlling the filter coefficients based on error between a target signal and an index value derived from the output signal, and further, of controlling the target signal such that the target signal is substantially proportional to the amplitude of the input signal to suppress the range of fluctuation of the filter coefficients.

The fourth signal processing method of the present invention includes: a first step of taking as an input signal a complex signal in which one of two signals that are generated from one real signal and that have phases shifted by 90° from each other is a real part and the other signal is an imaginary part, generating an output signal that is a complex signal by means of a convolution operation of the input signal and filter coefficients that are real signals, and supplying the result as output; and a second step of controlling the filter coefficients based on error between a target signal and an index value derived from the output signal and further, of controlling the target signal such that the target signal is substantially proportional to the amplitude of the input signal.

The fifth signal processing method of the present invention is a method according to any of the first to fourth signal processing methods in which, in the second step, when controlling the target signal based on the amplitude of the input signal, the target signal is decreased when the amplitude of the input signal is decreasing, the target signal is increased when the amplitude of the input signal is increasing, and further, the speed of decreasing the target signal is made greater than the speed of increasing the target signal.

The sixth signal processing method of the present invention is a method according to any of the first to fourth signal processing methods in which, when controlling the target signal based on the amplitude of the output signal in the second step, the target signal is decreased when the amplitude of the output signal is increasing, the target signal is increased when the amplitude of the output signal is decreasing, and further, the speed of decreasing the target signal is made greater than the speed of increasing the target signal.

The seventh method of the present invention is a method according to any of the first to sixth signal processing methods in which, in the second step, the value of the envelope of the output signal is taken as the index value.

The eighth signal processing method of the present invention is a method according to the seventh signal processing method in which the second step includes: a common process of controlling the target signal, generating a signal according to error between the target signal and the value of the envelope of the output signal, and supplying the result as output; and a plurality of separate processes provided for each multiplier for the convolution operations for calculating filter coefficients to be used in a next sampling cycle based on: the signal applied as input to the corresponding multiplier, the signal supplied as output from the common process, and the current filter coefficients.

The ninth signal processing method of the present invention is characterized by, instead of controlling the target signal, implementing equivalent control over an index value derived from the output signal.

In the present invention, a target signal is controlled based on at least one of the input signal and output signal of an adaptive digital filter to realize suppression of the range of fluctuation of filter coefficients, whereby filter coefficients do not become large values even when the level of the input signal is low. As a result, the present invention eliminates the need for higher accuracy of operations in which filter coefficients take values over a broad range for the purpose of preventing overflow, whereby the amount of operations can be decreased and the scale of hardware can be reduced. The amount of signal processing operations for realizing the adaptive digital filter can be reduced. This reduction is possible because the control of the target value eliminates the need for higher accuracy of operations in which the values of filter coefficients vary over a broad range to prevent overflow, whereby the amount of operations can be decreased and the scale of hardware can be reduced.

The limitations imposed on the sampling frequency encountered in the second technique of the related art are eliminated. The greater freedom is realized because an index value such as the value of the envelope can be calculated from each output signal that is a complex signal, and the sampling frequency can therefore be set freely.

BEST MODE FOR CARRYING OUT THE INVENTION

First Embodiment

Figure 3:
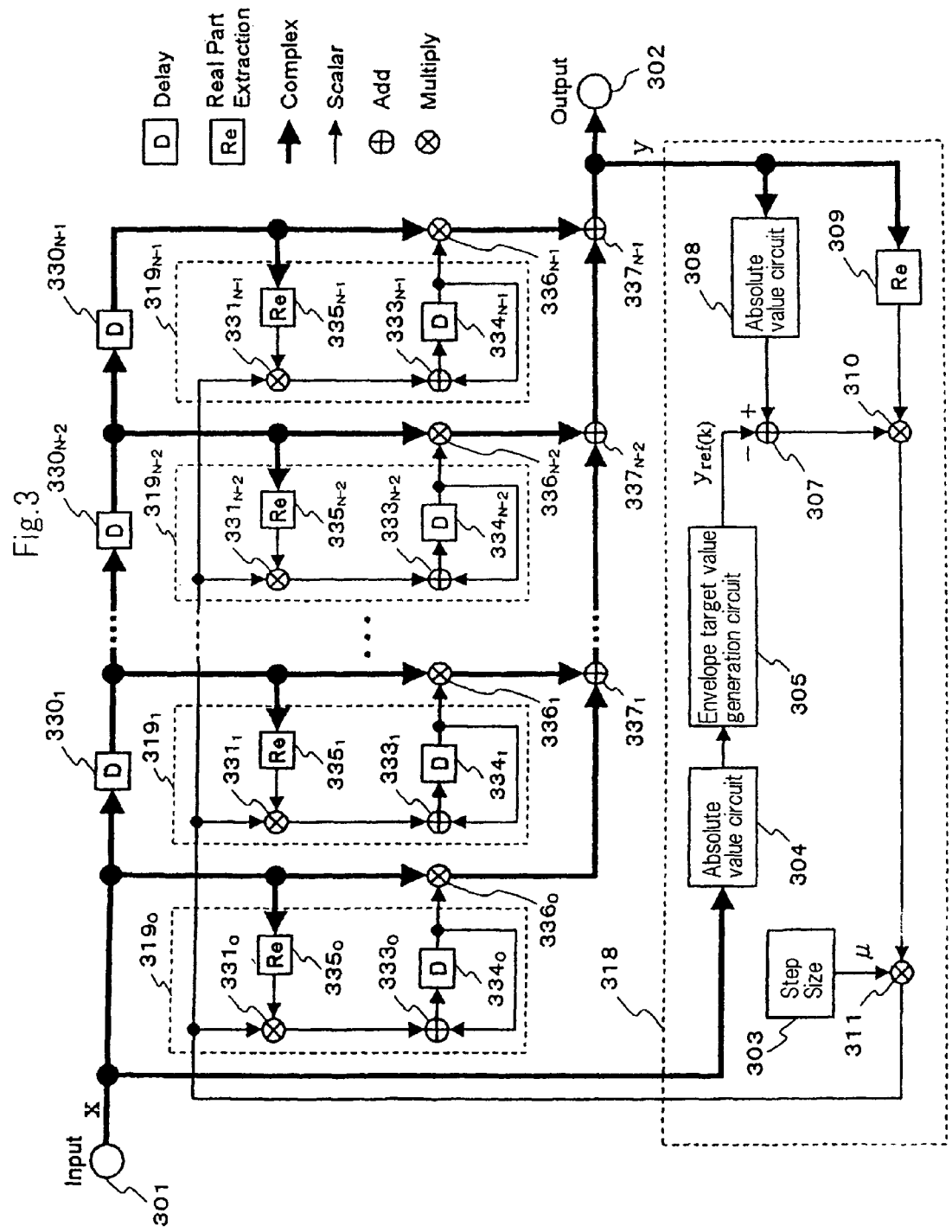
FIG. 3 is a block diagram of an adaptive digital filter according to the first embodiment of the present invention.

Referring to FIG. 3, the adaptive digital filter according to the first embodiment of the present invention is provided with: a filter unit for generating an output signal that is a complex signal (a complex output signal) by means of a convolution operation of a complex signal (a complex input signal) applied to input terminal 301 and filter coefficients that are real signals (real filter coefficients) and supplying the result as output to output terminal 302; and a coefficients control unit for controlling filter coefficients based on error between a target signal and an index value derived from the complex output signal (in the present embodiment, the value of the envelope). In the figure, the coefficients control unit is the portion of block 318 and N blocks $319_0$-$319_{N-1}$, the remaining portions making up the filter unit. Here, the complex input signal is a complex signal having one of two signals that are generated from one real signal and that have phases shifted 90° from each other as a real part and the other signal as an imaginary part.

The filter unit is an FIR (Finite Impulse Response) filter having a tap number N, i.e., having N filter coefficients, and is made up from: tapped delay line composed of N−1 delay units $330_1$-$330_{N-1}$ that each give a delay of one sampling cycle, N multipliers $336_0$-$336_{N-1}$ for multiplying the complex input signal and the output signals of each of delay units $330_1$-

$330_{N-1}$ by filter coefficients, and N−1 adders $337_1$-$337_{N-1}$ for successively adding the multiplication results of these N multipliers $336_0$-$336_{N-1}$.

The coefficients control unit uses an LMS as the adaptive algorithm and is further made up from: common unit 318 that is common to the control of all filter coefficients, and separate units $319_0$-$319_{N-1}$ for the control of each individual filter coefficients.

Common unit 318 is made up from: absolute value circuit 304 for calculating and supplying the envelope value (i.e., the amplitude value) of the complex input signal by means of the square sum of the real part and imaginary part; envelope target value generation circuit 305 for generating the envelope target value based on the amplitude value of the input signal transmitted from this absolute value circuit 304; absolute value circuit 308 for receiving as input the complex output signal that is the output of the filter unit, calculating the value of the envelope of the complex output signal from the square sum of the real part and imaginary part, and supplying the result as output; subtractor 307 for supplying the value obtained by subtracting the target value of the envelope from the value of the envelope that was found in absolute value circuit 308; real-part extraction circuit 309 for receiving as input the complex output signal and for extracting and supplying only the real part of this complex output signal; multiplier 310 for supplying the result of multiplying the output of subtractor 307 and the output of real-part extraction circuit 309; step-size generation circuit 303 for generating a step size, which is a parameter for determining the update amount of filter coefficients; and multiplier 311 for supplying each of separate units $319_0$-$319_{N-1}$ with the result obtained by multiplying the output of multiplier 310 and the step size.

In the case of the present embodiment, the filter coefficients are real numbers and not complex numbers, and the step size generated by step-size generation circuit 303 is therefore set to approximately four times the step size when using complex filter coefficients. The speed of convergence can thus be made equivalent to a case of using complex filter coefficients.

Each of separate units $319_0$-$319_{N-1}$ is made up from: real-part extraction circuits $335_0$-$335_{N-1}$ for receiving as input the complex input signal or the output signal of corresponding delay units $330_1$-$330_{N-1}$ on the tapped delay line, extracting and supplying only the real parts of these complex signals; multipliers $331_0$-$331_{N-1}$ for supplying the result of multiplying the signal received as input from common unit 318 and the real part extracted by real-part extraction circuits $335_0$-$335_{N-1}$; adders $333_0$-$333_{N-1}$ for adding the filter coefficients applied to multipliers $336_0$-$336_{N-1}$ and the outputs of multipliers $331_0$-$331_{N-1}$ and supplying the results as the filter coefficients to be used in a next sampling cycle; and delay units $334_0$-$334_{N-1}$ for delaying the outputs of these adders $333_0$-$333_{N-1}$ by just one sampling cycle and then supplying the results to multipliers $336_0$-$336_{N-1}$.

Figure 4:
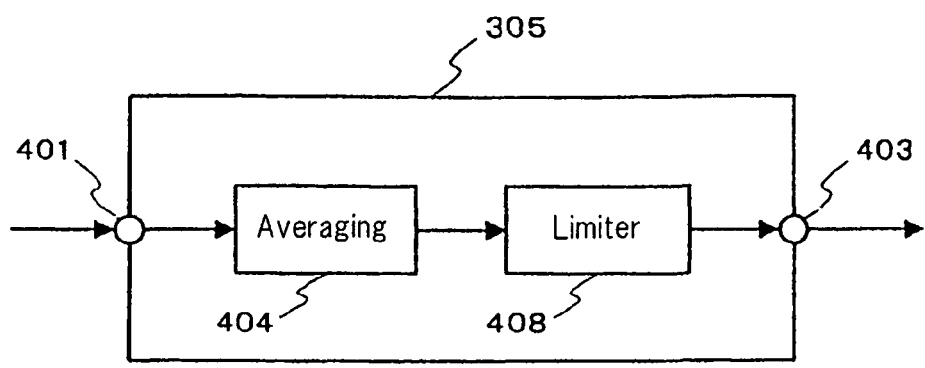
FIG. 4 is a block diagram of a working example of the envelope target value generation circuit used in the adaptive digital filter according to the first embodiment of the present invention.

Envelope target value generation circuit 305 generates a small envelope target value when the amplitude of the input signal is small, and generates a large envelope target value when the amplitude of the input signal is large. FIG. 4 shows a working example of envelope target value generation circuit 305. Referring to FIG. 4, envelope target value generation circuit 305 is made up from: averaging circuit 404 for finding a weighted average of signals supplied over a past fixed time interval from absolute value circuit 304 by way of input terminal 401; and limiter 408 for limiting the value found by this averaging circuit such that the value falls between a predetermined upper limit and lower limit and supplying the result by way of output terminal 403 as a time-variable envelope target value.

The algorithm of the adaptive digital filter of the present embodiment is expressed as shown below:

$$Wr(k+1)=Wr(k)-\mu(|y(k)|^p-yref(k))^q Re[y(k)]Re[X(k)] \quad (10)$$

$$y(k)=Wr^T(k)X(k) \quad (11)$$

$$yref(k)=Av[|x(k)|] \quad (12\text{-}1)$$

$$Av[|x(k)|]=(1-\beta)Av[|x(k-1)|]+\beta|x(k)| \quad (12\text{-}2)$$

where Wr(k) is a real coefficient vector, X(k) is a complex signal vector, Re[ ] is an operation for extracting the real part of a complex number, y(k) is a complex output signal, k is a sample index, N is the number of filter taps, yref is the time-variable envelope target value, μ is a parameter for determining the update amount of filter coefficients, Av[ ] is an operation for averaging, and β is a weighting coefficients and a positive constant that satisfies 0<β<1. In addition, the values p and q are constants for determining an evaluation function of the error with respect to the envelope target value and may be, for example, p=1 and q=1.

Explanation next regards the operations of the adaptive digital filter of the present embodiment.

Figure 5:
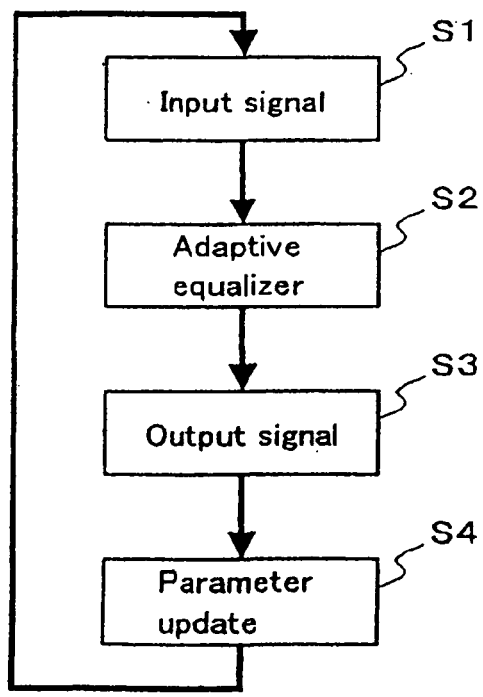
FIG. 5 is a flow chart showing the operations of the adaptive digital filter according to the first embodiment of the present invention.

FIG. 5 is a flow chart showing the operations of the adaptive digital filter of the present embodiment. Input process S1 in which a new complex input signal is received from input terminal 301, adaptive equalizing process S2, output process S3 in which a complex output signal is supplied to output terminal 302, and parameter updating process S4 are repeated. Adaptive equalizing process S2 is a process based on above-described Equation (11) and parameter updating process S4 is a process based on the above-described Equation (10). The following explanation regards the details of each operation.

Explanation first regards adaptive equalizing process S2. The complex input signal received at input terminal 301 is supplied to multiplier $336_0$ and real-part extraction circuit $335_0$, and at the same time, is supplied to the tapped delay line made up from delay units $330_1$-$330_{N-1}$ that cause delays of one sampling cycle. The complex input signal supplied to delay units $330_1$-$330_{N-1}$ is transmitted to an adjacent delay unit with each clock, and the output signals of each of delay units $330_1$-$330_{N-1}$ are then supplied to corresponding multipliers $336_1$-$336_{N-1}$ and corresponding real-part extraction circuits $335_1$-$335_{N-1}$.

In multiplier $336_0$, the real-number filter coefficients supplied from delay circuit $334_0$ is multiplied by the complex signal received from input terminal 301 and the result supplied to adder $337_1$. In multipliers $336_1$-$336_{N-1}$, the complex signals supplied from corresponding delay units $330_1$-$330_{N-1}$ are multiplied by the real-number filter coefficients supplied from corresponding delay units $334_1$-$334_{N-1}$ and the results are supplied to adders $337_1$-$337_{N-1}$. Adders $337_1$-$337_{N-1}$ add all of the complex signals received from multipliers $336_0$-$336_{N-1}$, supply the results to output terminal 302, and at the same time, supply the results to absolute value circuit 308 and real-part extraction circuit 309. In this way, an output signal that is a complex signal is generated by means of a convolution operation of the complex input signal and filter coefficients that are real signals and the result supplied as output.

Explanation next regards parameter updating process S4. Absolute value circuit 304 calculates the amplitude value of the complex input signal and supplies the result to envelope target value generation circuit 305. Averaging circuit 404 of envelope target value generation circuit 305 supplies limiter 408 with the result obtained by multiplying the amplitude value transmitted from absolute value circuit 304 by positive constant β and averaging, and limiter 408 supplies subtractor 307 with a value that is limited so as not to exceed an excessive value as the time-variable envelope target value. Absolute value circuit 308 receives the complex output signal, calculates the absolute value of this signal, and transmits the result as the value of the envelope to subtractor 307. Subtractor 307 subtracts the envelope target value received from envelope target value generation circuit 305 from the signal received from absolute value circuit 308 and transmits the result to multiplier 310. Real-part extraction circuit 309 receives the complex output signal, extracts only the real part of this signal, and transmits the result to multiplier 310. Multiplier 310 multiplies the signal received from subtractor 307 by the signal received from real-part extraction circuit 309 and transmits the result to multiplier 311. Step-size generation circuit 303 generates a step size, which is a parameter for determining the amount of filter coefficients updating in the filter unit and supplies the result to multiplier 311. Multiplier 311 multiplies the signal received from multiplier 311 by the step size supplied from step-size generation circuit 303 and transmits the result to each of separate units $319_0$-$319_{N-1}$.

In each of separate units $319_0$-$319_{N-1}$, the signal supplied from multiplier 311 is transmitted to multipliers $331_0$-$331_{N-1}$. Real-part extraction circuits $335_0$-$335_{N-1}$ each extract the real part of the complex signal supplied from corresponding delay units $330_1$-$330_{N-1}$ or input terminal 301 and transmit the result to corresponding multipliers $331_0$-$331_{N-1}$. Multipliers $331_0$-$331_{N-1}$ each multiply the real-number signals supplied from corresponding real-part extraction circuits $335_0$-$335_{N-1}$ with the real-number signals supplied from common unit 318 and transmit the results to corresponding adders $333_0$-$333_{N-1}$. Adders $333_0$-$333_{N-1}$ each add the real-number filter coefficients supplied from corresponding delay units $334_0$-$334_{N-1}$ to the real number signals received from corresponding multipliers $331_0$-$331_{N-1}$ and transmit the results to corresponding delay units $334_0$-$334_{N-1}$ as the filter coefficients of the next sampling. Delay units $334_0$-$334_{N-1}$ each confer a delay of one sample to the real-number filter coefficients received from corresponding adders $333_0$-$333_{N-1}$ and both supply the results to corresponding multipliers $336_0$-$336_{N-1}$ and transmit the results to corresponding adders $333_0$-$333_{N-1}$.

Explanation next regards the effects of the present embodiment.

The time-variable envelope target value generated by envelope target value generation circuit 305 is substantially proportional to the amplitude of the input signal of input terminal 301. If the amplitude of the input signal is, for example, "0.01," the envelope target value will be a value on the order of "0.01" and as a result, the filter coefficients will be value on the order of "1." In other words, filter coefficients do not become large values even when the level of the input signal is low, thereby eliminating the need for higher accuracy of operations such that the values of filter coefficients vary over a wide range to prevent overflow, and enabling both a decrease of the amount of operations and a reduction of the scale of hardware.

Figure 1:
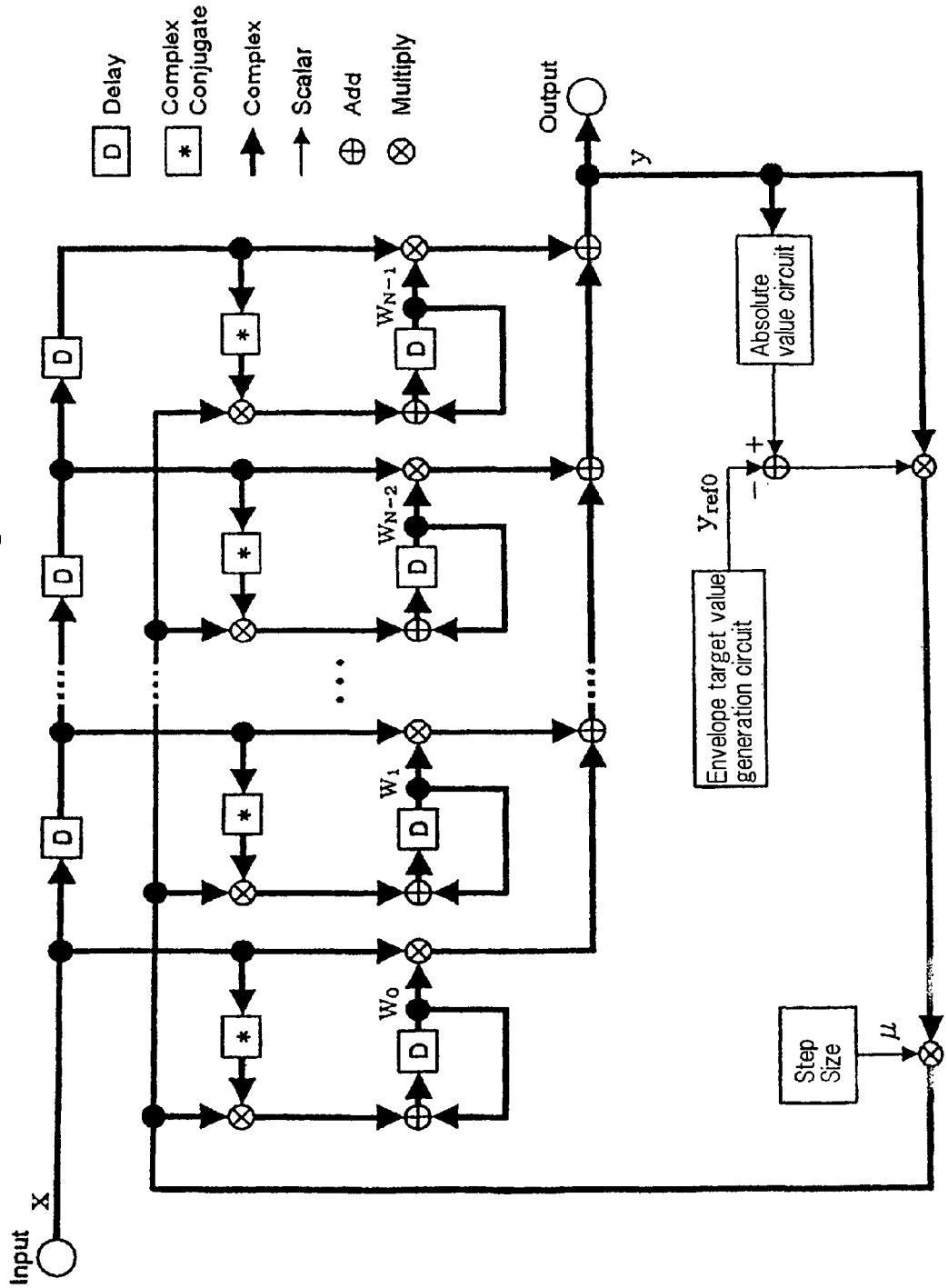
FIG. 1 is a block diagram of the adaptive digital filter of the first technique of the related art.
Figure 2:
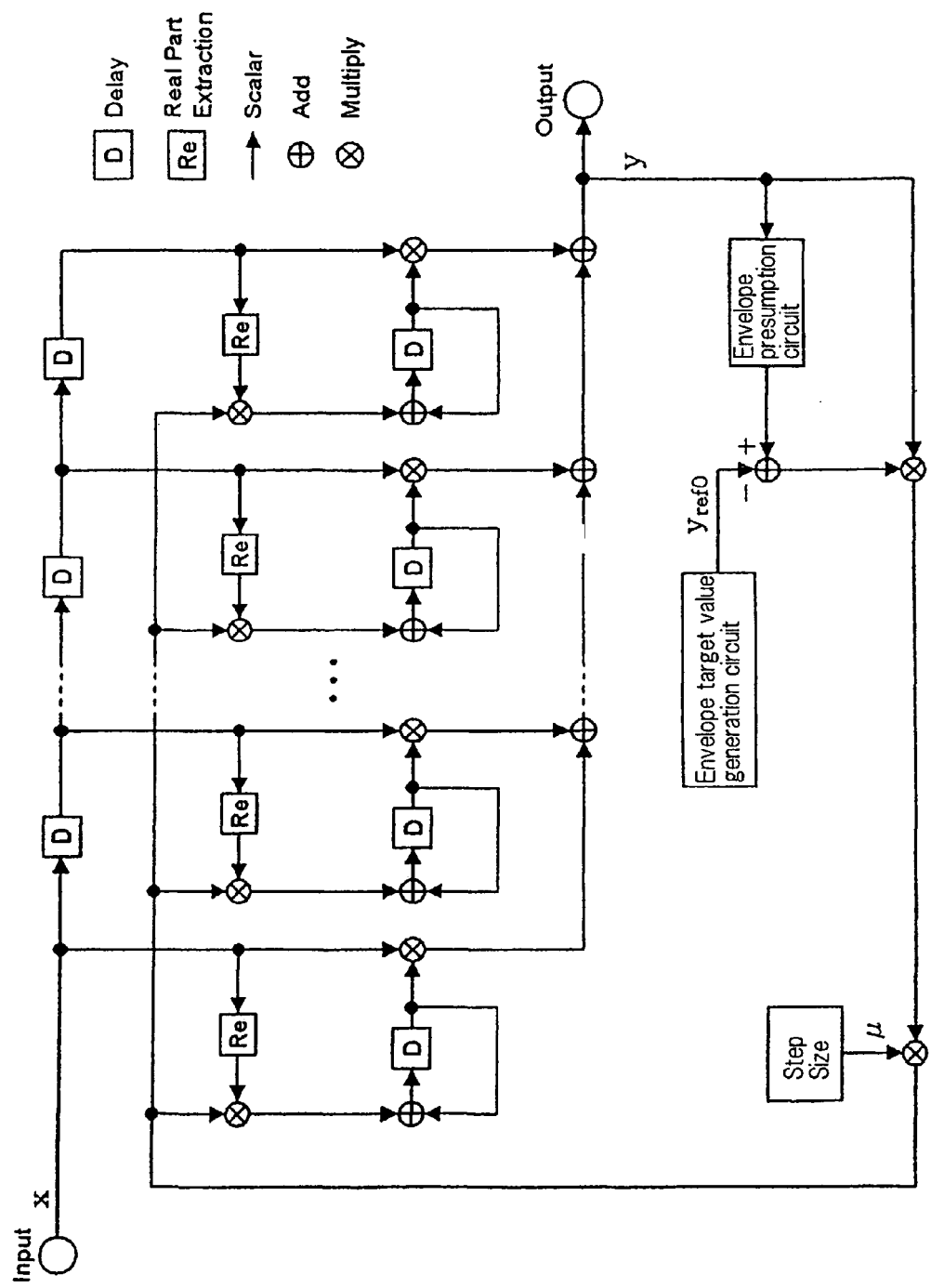
FIG. 2 is a block diagram of the adaptive digital filter of the second technique of the related art.

In addition, as can be seen by referring to FIG. 3, most of the signals in the adaptive digital filter of the present embodiment are real numbers and not complex numbers. The fact that most of the signals are real numbers and not complex numbers means that the amount of operations can be greatly decreased compared to the first technique of the related art shown in FIG. 1. The reason for this decrease is that all signals are complex numbers in the adaptive digital filter according to the first technique of the related art and multiplication is therefore carried out between complex numbers in all multipliers, whereas in the present embodiment, multiplication is carried out between complex numbers and real numbers in multipliers $336_0$-$336_{N-1}$ and between real numbers in multipliers $331_0$-$331_{N-1}$. The process of one multiplication between complex numbers is equivalent to the process of four multiplications between real numbers and two additions between real numbers, while the process of multiplication between a complex number and a real number is equivalent to just two multiplications between real numbers, and multiplication between real numbers is equivalent to just one multiplication between real numbers.

Accordingly, replacing locations at which multiplication was carried out between complex numbers in the first technique of the related art with multipliers $336_0$-$336_{N-1}$ that each carry out multiplication between a complex number and real number realizes a reduction in the amount of operations equivalent to N multiplications between real numbers. In addition, replacing locations at which multiplication is carried out between complex numbers in the first technique of the related art with multipliers $331_0$-$331_{N-1}$ that carry out multiplication between real numbers realizes a reduction in the amount of operations equivalent to 3N multiplications between real numbers and 2N additions between real numbers. Finally, the portion of real-part extraction circuits $335_0$-$335_{N-1}$ necessitated complex conjugators in the first technique of the related art, and as a result, the amount of operations is reduced to the extent that the code of an imaginary part is not transmitted.

Based on the foregoing explanation, the present embodiment enables a decrease of the amount of operations to approximately 40% of the first technique of the related art.

In the present embodiment, moreover, the output signal of the filter unit is obtained as a complex number, and the value of the envelope of the output signal, i.e., the amplitude, is therefore obtained instantaneously and accurately as the output signal of absolute value circuit 308 shown in FIG. 3. Accordingly, the present embodiment is not subject to the limitations on sampling frequency that applied in second technique of the related art. In other words, although the filter coefficients are real numbers in the present embodiment, the input signal is a complex signal having one of two signals for which phases differ by 90° as a real part and the other signal as an imaginary part, and as a result, the output signal generated by a convolution operation of the input signal and the filter coefficients is also a complex signal having one signal of two signals for which phases differ from each other by 90° as a real part and the other signal as an imaginary part, whereby the value of the envelope of the output signal can be found both instantaneously and accurately as in the first technique of the related art and, moreover, the sampling frequency is freed from the limitations that applied in the second technique of the related art. Making the filter coefficients real numbers further enables a great reduction in the amount of operations. In addition, the real part and imaginary part of the complex signal that is the input signal are originally generated from the same single real signal and differ only in that their phases are shifted by 90° from each other, the reason for conversion to a complex signal being only to enable instantaneous calculation of the value of the envelope of the output signal. As a result, filtering performance as an adaptive digital filter does not suffer by comparison with either the first technique of the related art that handles the real part and imaginary part of the input signal or the second technique of the related art that handles only the real part (or imaginary part) of the input signal.

Second Embodiment

Figure 6:
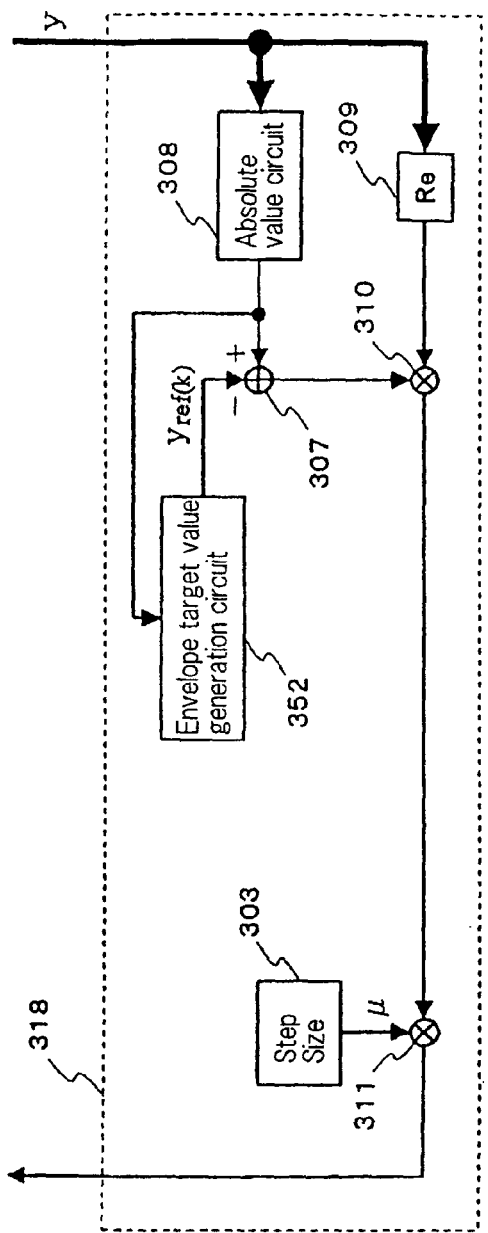
FIG. 6 is a block diagram of the principal components of the adaptive digital filter according to the second embodiment of the present invention.

Referring to FIG. 6, the adaptive digital filter according to the second embodiment of the present invention differs from the adaptive digital filter according to the first embodiment in that envelope target value is generated based on the output signal of the adaptive digital filter.

Figure 7:
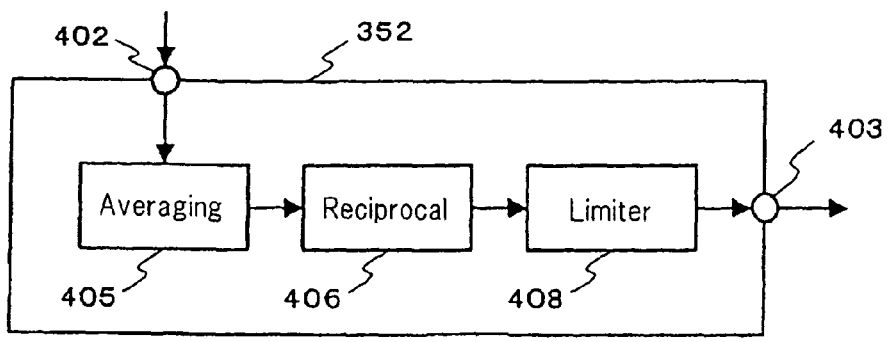
FIG. 7 is a block diagram of a working example of the envelope target value generation circuit used in the adaptive digital filter according to the second embodiment of the present invention.

Envelope target value generation circuit 352 generates an envelope target value based on the value of the envelope (i.e., the amplitude value) of the output signal of the adaptive digital filter that is found in absolute value circuit 308 and supplies the envelope target value to subtractor 307. Envelope target value generation circuit 352 generates a small envelope target value when the amplitude of the output signal is large and generates a large envelope target value when the amplitude of the output signal is small. FIG. 7 shows a working example of envelope target value generation circuit 352.

Referring to FIG. 7, envelope target value generation circuit 352 is made up from: averaging circuit 405 for finding the weighted average of a signal that is supplied over a past fixed time interval from absolute value circuit 308 by way of input terminal 402; reciprocal circuit 406 for calculating the reciprocal of the value found in this averaging circuit 405; and limiter 408 for limiting such that the reciprocal calculated in reciprocal circuit 406 falls between a predetermined upper limit and a lower limit and supplying the reciprocal as the time-variable envelope target value by way of output terminal 403.

The configuration is otherwise identical to that of the first embodiment. In addition, the operations of the present embodiment are identical to those of the first embodiment with the exception of the operation of envelope target value generation circuit 352.

Explanation next regards the effects of the present embodiment.

The envelope target value generated by envelope target value generation circuit 352 decreases when the amplitude of the output signal supplied from the output terminal of the adaptive digital filter is large. Increase in the size of the output signal raises the possibility that the values of internal signals and filter coefficients in the filter unit are also large. Decreasing the envelope target value changes the values of internal signals and filter coefficients to a downward trend. In other words, the values of filter coefficients and internal signals fall within a fixed range. Not diverging from a fixed range means the probability of the occurrence of overflow in the filter coefficients and internal signals is reduced. Accordingly, as in the first embodiment, the present embodiment eliminates the need for higher accuracy of operations in which the values of filter coefficients vary over a broad range to prevent overflow and enables decrease of the amount of operations and a reduction of the scale of hardware.

Finally, as in the first embodiment, the amount of operations required for the convolution operation of the input signal and filter coefficients can be reduced because the filter coefficients are real signals and not complex amounts.

Third Embodiment

Figure 8:
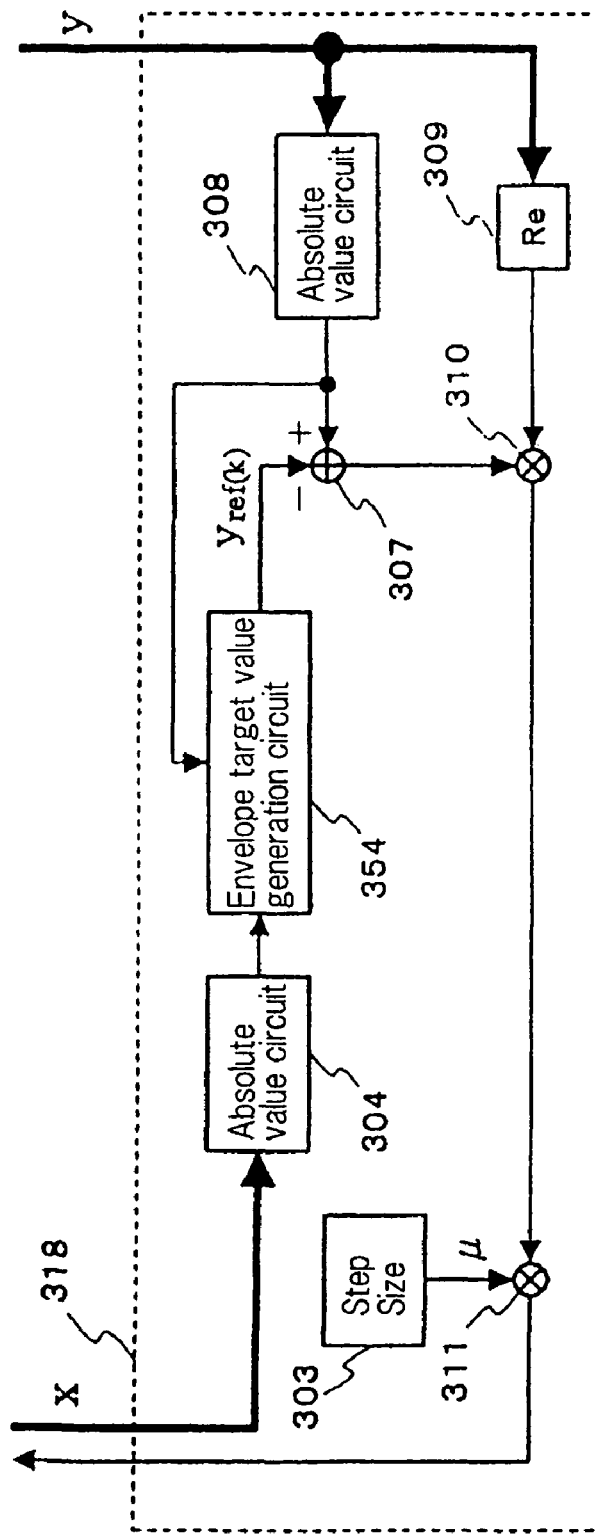
FIG. 8 is block diagram of the principal components of the adaptive digital filter according to the third embodiment of the present invention.

Referring to FIG. 8, the adaptive digital filter according to the third embodiment of the present invention differs from the adaptive digital filter according to the first embodiment in that the envelope target value is generated based on both the input signal and output signal of the adaptive digital filter.

Envelope target value generation circuit 354 generates an envelope target value based on the value of the envelope (amplitude value) of the input signal of the adaptive digital filter that is found in absolute value circuit 304 and the value of the envelope (amplitude value) of the output signal of the adaptive digital filter found in absolute value circuit 308 and supplies the envelope target value to subtractor 307. Envelope target value generation circuit 354 generates a small envelope target value when the amplitude of the input signal is small and generates a large envelope target value when the amplitude of the input signal is large. In addition, envelope target value generation circuit 354 generates a small envelope target value when the amplitude of the output signal is large, and generates a large envelope target value when the amplitude of the output signal is small.

Figure 9:
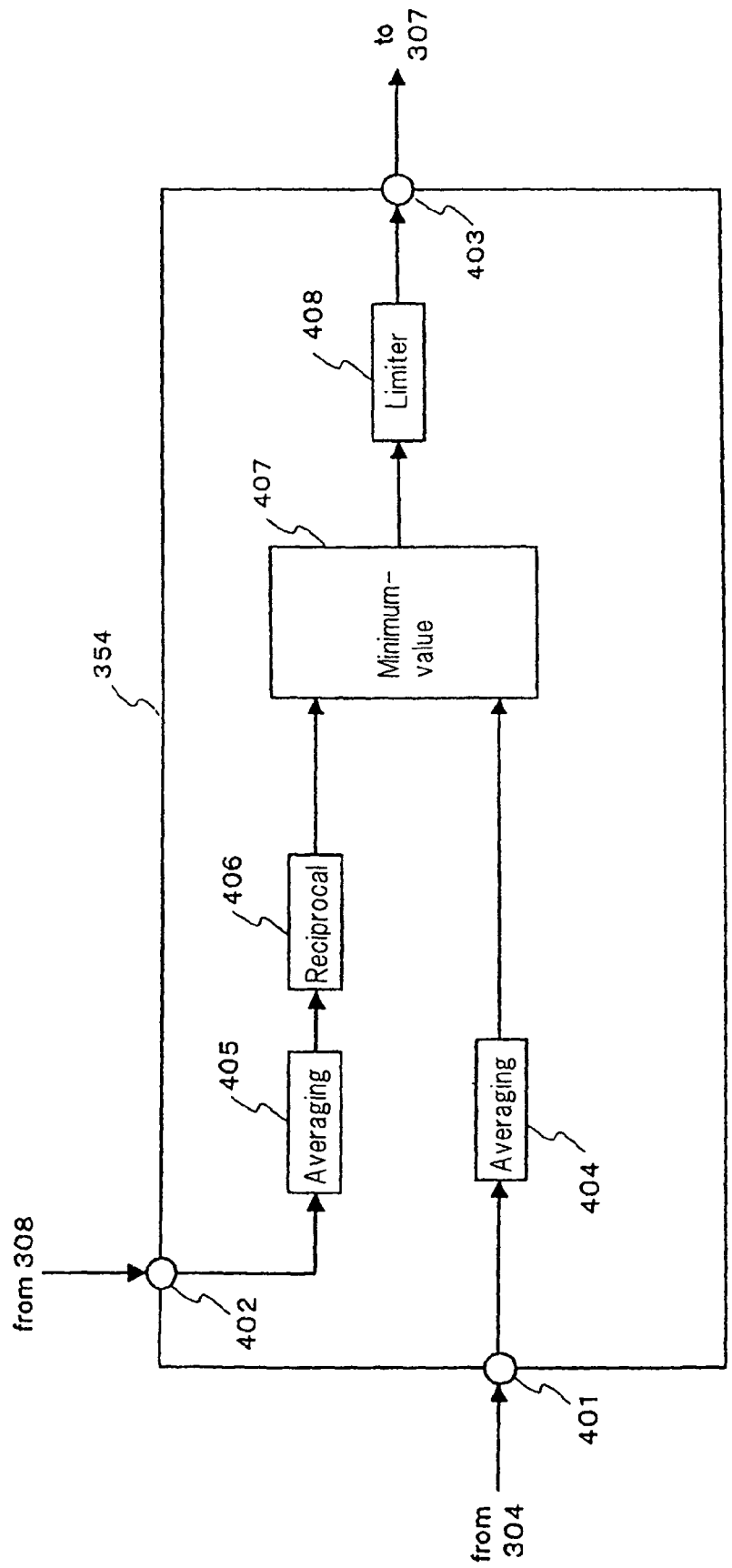
FIG. 9 is a block diagram of a working example of the envelope target value generation circuit used in the adaptive digital filter according to the third embodiment of the present invention.

Referring to FIG. 9, envelope target value generation circuit 354 is made up from: averaging circuit 405 for finding the weighted average of a signal that is supplied over a past fixed time interval from absolute value circuit 308 by way of input terminal 402; reciprocal circuit 406 for calculating the reciprocal of the value that is found in this averaging circuit 405; averaging circuit 404 for finding the weighted average of a signal supplied over a past fixed time interval from absolute value circuit 304 by way of input terminal 401; minimum-value circuit 407 for selecting the smaller value of the value supplied from reciprocal circuit 406 and the value supplied from averaging circuit 404; and limiter 408 for implementing control such that the value selected by minimum-value circuit 407 falls between a lower limit and upper limit that have been determined in advance and supplying the value by way of output terminal 403 as a time-variable envelope target value. The reason for here selecting the smaller value in minimum-value circuit 407 is that a smaller envelope target value provides a further reduction of the probability of the occurrence of overflow of filter coefficients.

The configuration is otherwise identical to that of the first embodiment. In addition, the operations of the present embodiment are identical to those of the first embodiment with the exception of the operation of envelope target value generation circuit 354.

Explanation next regards the effect of the present embodiment.

The characteristics of the envelope target value generated by envelope target value generation circuit 354 combine both the characteristics of the envelope target value generated by envelope target value generation circuit 305 in the first embodiment and the characteristics of envelope target value generated by envelope target value generation circuit 352 in the second embodiment, and the probability of the occurrence of overflow of filter coefficients is therefore reduced. Accordingly, as in the first embodiment, the present embodiment eliminates the need for higher accuracy of operations in which the values of filter coefficients vary over a broad range to prevent overflow, and enables a decrease of the amount of operations and a reduction of the scale of hardware. In addition, as in the first embodiment, the amount of operations required for the convolution operation of the input signal and the filter coefficients is reduced because the filter coefficients are real signals and not complex amounts.

Fourth Embodiment

Figure 10:
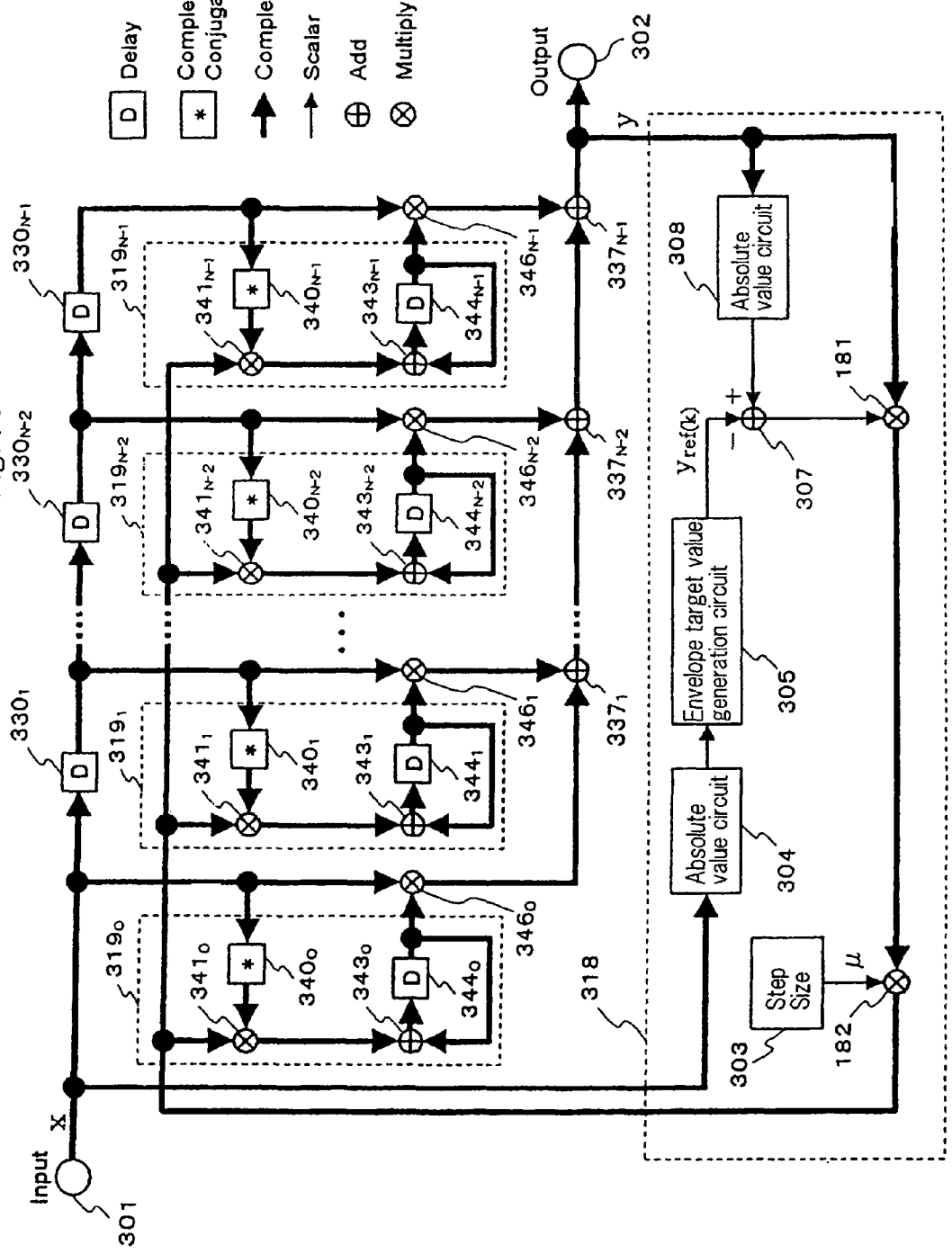
FIG. 10 is a block diagram of the adaptive digital filter according to the fourth embodiment of the present invention.

Referring to FIG. 10, the adaptive digital filter according to the fourth embodiment of the present invention is provided with: a filter unit for generating an output signal that is a complex signal (a complex output signal) by means of a convolution operation of a complex signal (complex input signal) that is applied to input terminal 301 and filter coefficients that are complex signals (complex filter coefficients) and supplying the result to output terminal 302; and coefficients control unit for controlling filter coefficients based on error between a target signal and an index value derived from the complex output signal (in the present embodiment, the value of the envelope). Block 318 and the N blocks $319_0$-$319_{N-1}$ in the figure are the coefficients control unit, and the remaining parts make up the filter unit. Here, the complex input signal is a complex signal having one of two signals that are generated from one real signal and that have phases shifted from each other by 90° as a real part and the other signal as an imaginary part.

The filter unit is an FIR (Finite Impulse Response) filter in which the tap number is N, i.e., the number of filter coefficients is N, and that is made up from: a tapped delay line composed of N−1 delay units $330_1$-$330_{N-1}$ that each confer a delay of one sampling cycle; N multipliers $346_0$-$346_{N-1}$ for multiplying the complex input signal and the output signals of each of delay units $330_1$-$330_{N-1}$ by filter coefficients; and N−1 adders $337_1$-$337_{N-1}$ for successively adding the multiplication results of these N multipliers $346_0$-$346_{N-1}$.

In addition, the coefficients control unit uses as the adaptive algorithm a complex LMS that has been expanded to handle complex numbers and is made up from: common unit 318 that is common to the control of all filter coefficients, and separate units $319_0$-$319_{N-1}$ for the control of each individual filter coefficients.

Common unit 318 is made up from: absolute value circuit 304 for calculating the value of the envelope (i.e., the amplitude value) of the complex input signal by means of the square sum of the real part and imaginary part and supplying the result; envelope target value generation circuit 305 for generating an envelope target value based on the amplitude value of the input signal that is transmitted from absolute value circuit 304; absolute value circuit 308 for receiving as input the complex output signal that is the output of the filter unit, calculating the value of the envelope of the complex output signal by means of the square sum of the real part and the imaginary part, and supplying the result; subtractor 307 for supplying the value obtained by subtracting the envelope target value from the value of the envelope found in absolute value circuit 308; multiplier 181 for supplying the result of multiplying the output of subtractor 307 with the complex output signal; step-size generation circuit 303 for generating a step size, which is a parameter for determining the update amount of filter coefficients; and multiplier 182 for supplying each of separate units $319_0$-$319_{N-1}$ with the result of multiplying the output of multiplier 181 and the step size.

Separate units $319_0$-$319_{N-1}$ are each made up from: complex conjugators $340_0$-$340_{N-1}$ for receiving the complex input signal or the output signals of corresponding delay units $330_1$-$330_{N-1}$ on the tapped delay line and subjecting these complex signals to a complex conjugation transform and supplying the result as output; multipliers $341_0$-$341_{N-1}$ for supplying the result of multiplying the signal received as input from common unit 318 with complex signals supplied from complex conjugators $340_0$-$340_{N-1}$; adders $343_0$-$343_{N-1}$ for adding the filter coefficients applied to multipliers $346_0$-$346_{N-1}$ and the output of multipliers $341_0$-$341_{N-1}$ and supplying the results as filter coefficients to be used in a next sampling cycle; and delay units $344_0$-$344_{N-1}$ for delaying the output of adders $343_0$-$343_{N-1}$ by just one sampling cycle and supplying the results to multipliers $346_0$-$346_{N-1}$.

Similar to the first embodiment, envelope target value generation circuit 305 is provided with the configuration shown in FIG. 4, generates a small envelope target value when the amplitude of the input signal is small, and generates a large envelope target value when the amplitude of the input signal is large. The algorithm of the adaptive digital filter of the present embodiment is expressed as shown below:

$$W(k+1)=W(k)-\mu(|y(k)|^p-yref(k))^q y(k) X^H(k) \quad (13)$$

$$y(k)=W^T(k)X(k) \quad (14)$$

$$W(k)=[w0(k),w1(k),\ldots,wN-1(k)]^T \quad (15)$$

$$X(k)=[x(k),x(k-1),\ldots,x(k-N+1)]^T \quad (16)$$

$$yref(k)=Av[|x(k)|] \quad (17)$$

$$Av[|x(k)|]=(1-\beta)Av[|x(k-1)|]+\beta|x(k)| \quad (18)$$

where W(k) is a filter coefficient vector, X(k) is a complex signal vector, k is a sample index, N is the filter tap number, y(k) is the output signal, yref is the time-variable envelope target value, μ is a parameter for determining the update amount of filter coefficients, Av[ ] represents the operation of averaging, and β is a weighting coefficients and is a positive constant that satisfies the relation 0<β<1. In addition, H represents a complex conjugate transposition and T represents a transposition. The values p and q are constants for determining an evaluation function of the error with respect to the envelope target value, the values of p and q being, for example, p=1 and q=1.

Explanation next regards the operations of the adaptive digital filter of the present embodiment.

The adaptive digital filter of the present embodiment repeats adaptive equalizing process S2 and parameter updating process S4 shown in FIG. 5 with each input of a new complex input signal to input terminal 301, as in the first embodiment. However, adaptive equalizing process S2 is a process based on the above-described Equation (14), and parameter updating process S4 is a process based on the above-described Equation (13). The operations of each process are next described in detail.

Explanation first regards adaptive equalizing process S2. The complex input signal applied as input to input terminal 301 is supplied to multiplier $346_0$ and complex conjugator $340_0$, and at the same time, is supplied to the tapped delay line composed of delay units $330_1$-$330_{N-1}$ that produce a delay of one sampling cycle. The complex signal supplied to delay units $330_1$-$330_{N-1}$ is transmitted to an adjacent delay unit with each clock, and the output signals of each of delay units $330_1$-$330_{N-1}$ are supplied to corresponding multipliers $346_1$-$346_{N-1}$ and corresponding complex conjugators $340_1$-$340_{N-1}$.

In multiplier $346_0$, the complex signal received from input terminal 301 is multiplied by the complex filter coefficients supplied from delay unit $344_0$ and the result is supplied to adder $337_1$. In multipliers $346_1$-$346_{N-1}$, the complex signals supplied from corresponding delay units $330_1$-$330_{N-1}$ are multiplied by the complex filter coefficients supplied from corresponding delay units $344_1$-$344_{N-1}$ and the results supplied to adders $337_1$-$337_{N-1}$. Adders $337_1$-$337_{N-1}$ add all of the complex signals received from multipliers $346_0$-$346_{N-1}$, supply the results to output terminal 302, and at the same time, supply the results to absolute value circuit 308 and multiplier 181. In this way, an output signal that is a complex signal is generated by means of a convolution operation of the complex input signal and filter coefficients that are complex signals and the results supplied as output.

Explanation next regards parameter updating process S4. Absolute value circuit 304 calculates the amplitude value of the complex input signal and supplies the result to envelope target value generation circuit 305. Envelope target value generation circuit 305 generates an envelope target value that is substantially proportional to the input signal and supplies the result to subtractor 307. On the other hand, absolute value circuit 308 receives the complex output signal, calculates the absolute value of the signal, and transmits the result as the envelope value to subtractor 307. Subtractor 307 subtracts the envelope target value received from envelope target value generation circuit 305 from the signal received from absolute value circuit 308 and transmits the result to multiplier 181. Multiplier 181 multiplies the signal received from subtractor 307 by the complex output signal and transmits the result to multiplier 182. Step-size generation circuit 303 generates a step size, which is a parameter for determining the amount of update of filter coefficients in the filter unit, and supplies the step size to multiplier 182. Multiplier 182 multiplies the signal received from multiplier 181 by the step size supplied from step-size generation circuit 303 and transmits the result to each of separate units $319_0$-$319_{N-1}$.

In each of separate units $319_0$-$319_{N-1}$, the signal supplied from multiplier 182 is transmitted to multipliers $341_0$-$341_{N-1}$. Complex conjugators $340_0$-$340_{N-1}$ each subject the complex signals supplied from corresponding delay units $330_1$-$330_{N-1}$ or input terminal 301 to a complex conjugation transform and supply the results to corresponding multipliers $341_0$-$341_{N-1}$. Multipliers $341_0$-$341_{N-1}$ multiply the real signals supplied from corresponding complex conjugators $340_0$-$340_{N-1}$ with the complex signal supplied from common unit 318 and transmit the results to corresponding adders $343_0$-$343_{N-1}$. Adders $343_0$-$343_{N-1}$ each add the complex filter coefficients supplied from corresponding delay units $344_0$-$344_{N-1}$ to the complex signal received from corresponding multipliers $341_0$-$341_{N-1}$ and transmit the results to corresponding delay units $344_0$-$344_{N-1}$ as the filter coefficients to be used in the next sample. Delay units $344_0$-$344_{N-1}$ each delay by one sample the complex filter coefficients received from corresponding adders $343_0$-$343_{N-1}$ and both supply the result to corresponding multipliers $346_0$-$346_{N-1}$ and transmit the results to corresponding adders $343_0$-$343_{N-1}$.

Explanation next regards the effects of the present embodiment.

The time-variable envelope target value generated by envelope target value generation circuit 305 is substantially proportional to the amplitude of the input signal of input terminal 301, and as a result, filter coefficients do not become large values even when the input signal level is low, as in the first embodiment. The present embodiment therefore eliminates the need for higher accuracy of operations in which the values of filter coefficients vary over a broad range to prevent overflow and enables both the decrease of the amount of operations and the reduction of the scale of hardware.

Fifth Embodiment

Figure 11:
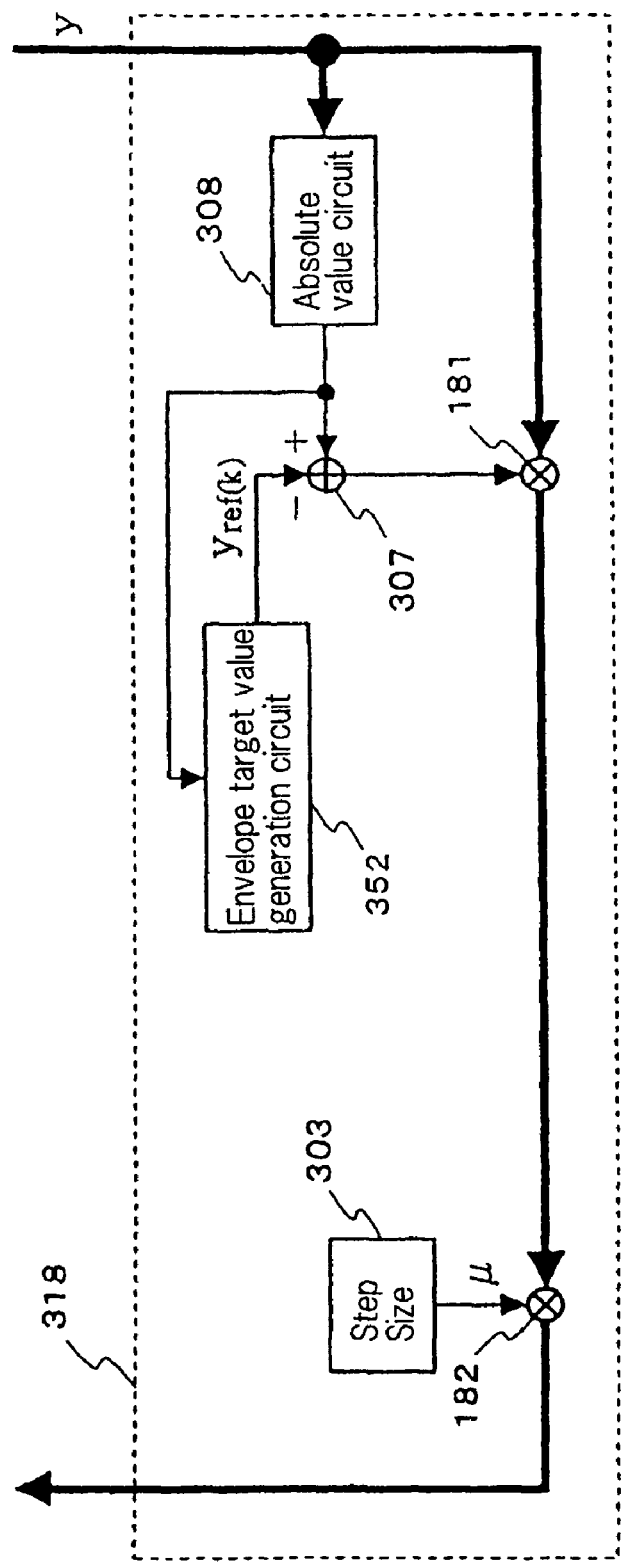
FIG. 11 is a block diagram of the principal components of the adaptive digital filter according to the fifth embodiment of the present invention.

Referring to FIG. 11, the adaptive digital filter according to the fifth embodiment of the present invention differs from the adaptive digital filter according to the fourth embodiment in that the envelope target value is generated based on the output signal of the adaptive digital filter.

Similar to the second embodiment, envelope target value generation circuit 352 is provided with a configuration such as shown in FIG. 7, generates a small envelope target value when the amplitude of the output signal is large, and generates a large envelope target value when the amplitude of the output signal is small.

The configuration is otherwise identical to that of the fourth embodiment. In addition, the operations of the present embodiment are identical to those of the fourth embodiment with the exception of the operation of envelope target value generation circuit 352.

Explanation next regards the effects of the present embodiment.

The envelope target value generated by envelope target value generation circuit 352 decreases when the amplitude of the output signal supplied from the output terminal of the adaptive digital filter becomes large. Increase in the output signal raises the possibility that the values of internal signals or filter coefficients in the filter unit will also be large. Decreasing the envelope target value changes the values of internal signals or filter coefficients to a downward trend. In other words, the values of the filter coefficients and internal signals are kept within a fixed range. Keeping the values within a fixed range means that the probability of the occurrence of overflow in the internal signals or filter coefficients is reduced. Accordingly, as in the fourth embodiment, the present embodiment eliminates the need for higher accuracy of operations in which the values of filter coefficients vary over a broad range for preventing overflow and enables both a decrease of the amount of operations and a reduction of the scale of hardware.

Sixth Embodiment

Figure 12:
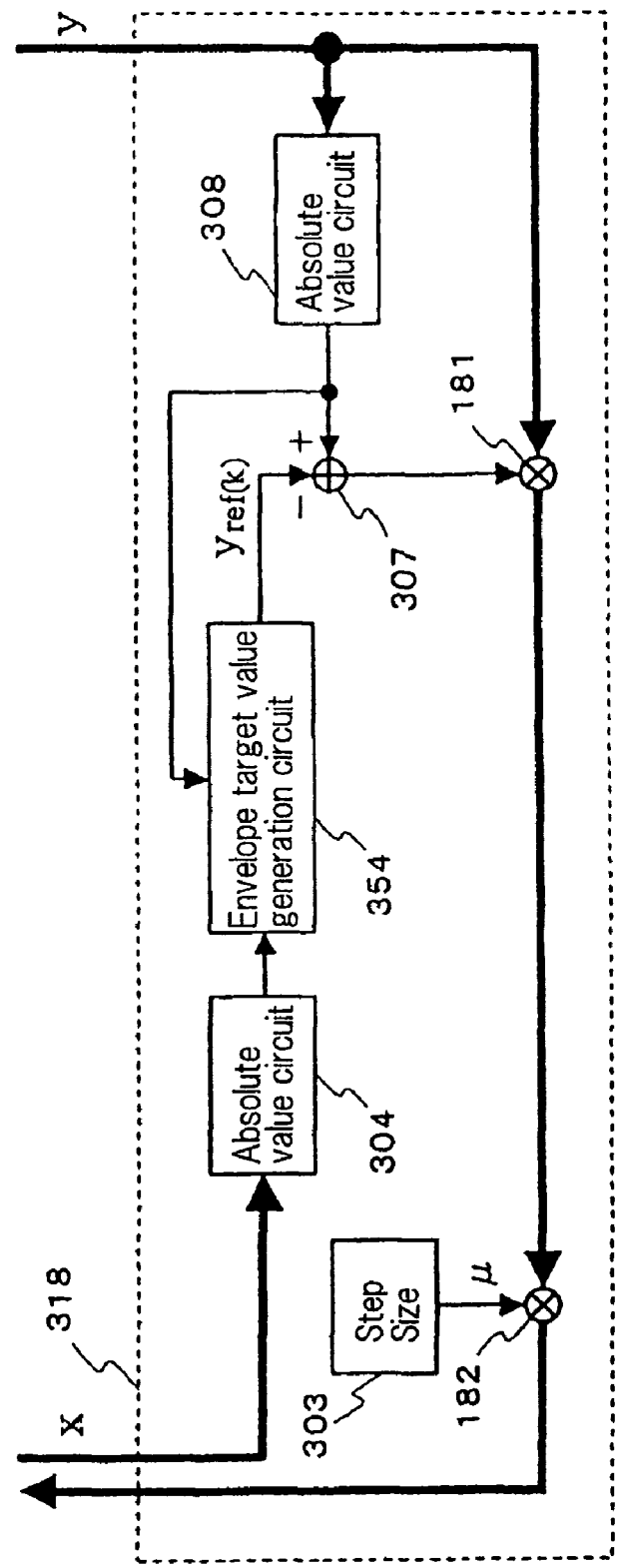
FIG. 12 is a block diagram of the principal components of the adaptive digital filter according to the sixth embodiment of the present invention.

Referring to FIG. 12, the adaptive digital filter according to the sixth embodiment of the present invention differs from the adaptive digital filter according to the fourth embodiment in that the envelope target value is generated based on both the input signal and output signal of the adaptive digital filter.

Envelope target value generation circuit 354 generates an envelope target value based on the value of the envelope (amplitude value) of the input signal of the adaptive digital filter that is found in absolute value circuit 304 and the value of the envelope (amplitude value) of the output signal of the adaptive digital filter that is found in absolute value circuit 308 and supplies the result to subtractor 307. As in the third embodiment, envelope target value generation circuit 354 is provided with a configuration such as shown in FIG. 9, generates a small envelope target value when the amplitude of the input signal is small, and generates a large envelope target value when the amplitude of the input signal is large. Envelope target value generation circuit 354 further generates a small envelope target value when the amplitude of the output signal is large, and generates a large envelope target value when the amplitude of the output signal is small.

The configuration is otherwise identical to that of the fourth embodiment. In addition, the operations of the current embodiment are identical to those of the fourth embodiment with the exception of the operation of envelope target value generation circuit 354.

Explanation next regards the effects of the present embodiment.

The properties of the envelope target value generated by envelope target value generation circuit 354 combine both the properties of the envelope target value generated by envelope target value generation circuit 305 of the fourth embodiment and the properties of the envelope target value generated by envelope target value generation circuit 352 in the fifth embodiment, and the probability that filter coefficients will cause overflow is therefore lowered. Thus, as with the fourth embodiment, the present embodiment eliminates the need for higher accuracy of operations in which filter coefficients take on a wide range of values to prevent overflow and enables a decrease of the amount of operations and a reduction of the scale of hardware.

Figure 13:
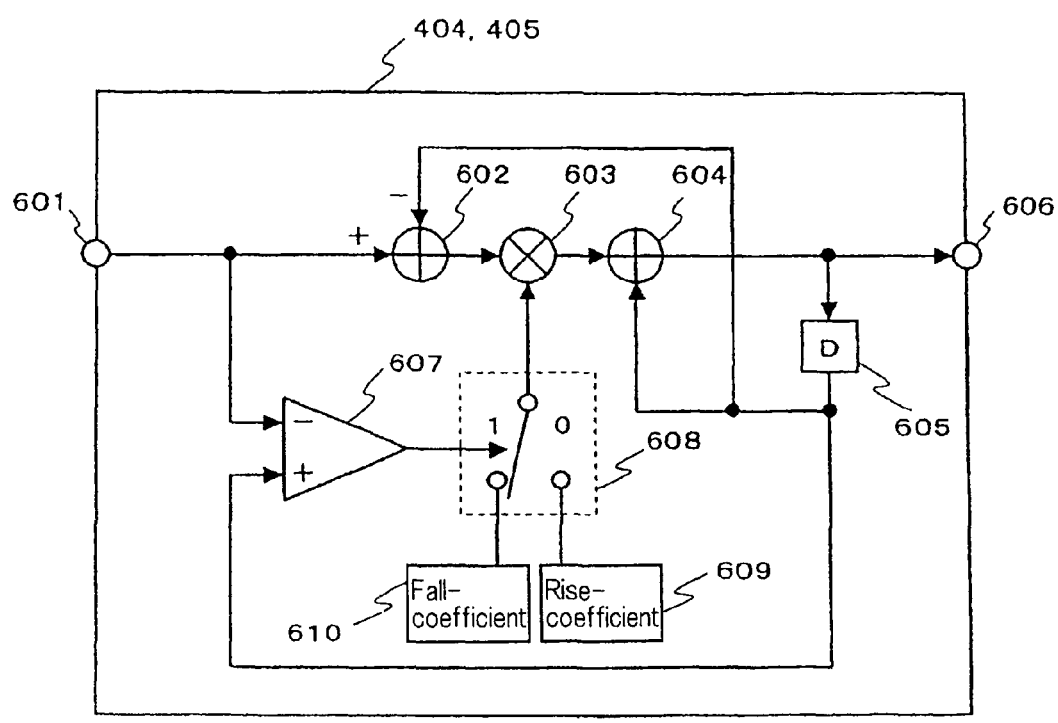
FIG. 13 is a block diagram of a working example of the averaging circuit used in the envelope target value generation circuit.

Explanation next regards a suitable working example of averaging circuits 404 and 405, which are constituent elements of envelope target value generation circuits 305, 352, and 354 of each of the above-described embodiments. Referring to FIG. 13, in a suitable working example of an averaging circuit, a signal that is received by way of input terminal 601 is transmitted to subtractor 602 and comparator 607. Comparator 607 compares the signal transmitted from input terminal 601 with a signal transmitted from delay unit 605, supplies the comparison result "0" when the signal transmitted from input terminal 601 is greater than the signal transmitted from delay unit 605, and supplies the comparison result "1" when the signal transmitted from input terminal 601 is smaller than the signal transmitted from delay unit 605, this output being transmitted to switch 608. The output value can be either value when the signal transmitted from input terminal 601 is of the same magnitude as the signal transmitted from delay unit 605.

Switch 608 transmits to multiplier 603 the fall coefficients received from fall-coefficient generator 610 when the comparison result transmitted from comparator 607 is "1" or transmits to multiplier 603 the rise coefficients transmitted from rise-coefficients generator 609 when the comparison result is "0." Subtractor 602 subtracts the signal transmitted from delay unit 605 from the input signal transmitted from input terminal 601 and transmits the result to multiplier 603. Multiplier 603 multiplies the signal transmitted from subtractor 602 by the fall coefficients or the rise coefficient transmitted from switch 608 and transmits the result to adder 604. Adder 604 adds the signal transmitted from delay unit 605 to the signal transmitted from multiplier 603 and transmits the result to delay unit 605 and output terminal 606. Delay unit 605 delays the signal transmitted from adder 604 by one sample and transmits the result to comparator 607, adder 604, and subtractor 602. Output terminal 606 supplies the signal transmitted from adder 604 as the averaged signal of the signal received from input terminal 601.

The feature of the averaging circuit of the present working example is that the coefficients supplied to multiplier 603 from switch 608 is switched by means of the comparison result of comparator 607. The rise coefficients and fall coefficients assume values from "0" to "1." The rise coefficients determines the speed of increase of the averaged output signal that is supplied to output terminal 606 when the input signal applied to input terminal 601 is increasing. The fall coefficients determines the speed of decrease of the averaged output signal that is supplied to output terminal 606 when the input signal applied to input terminal 601 is decreasing. In other words, the rise coefficients and fall coefficient determine the time constant of averaging. Thus, if the fall coefficients are greater than the rise coefficient, the signal supplied from output terminal 606 tends to increase and does not tend to decrease in the event of increase or decrease of the value of the input signal applied to input terminal 601. On the other hand, if the fall coefficient is smaller than the rise coefficient, the signal supplied from output terminal 606 tends to decrease and does not tend to increase.

In the case of averaging circuit 404 that averages the amplitude value of the input signal, the fall coefficient is set large and the rise coefficient is set small, whereby the time constant of averaging becomes shorter when the input signal is smaller than the output signal and the time constant of averaging becomes longer when the input signal is greater than the output signal. In this way, the output signal of averaging circuit 404 tends to decrease and tends not to increase. As a result, the envelope target value tends to decrease and tends not to increase. A smaller envelope target value further reduces the probability of the occurrence of overflow of filter coefficients and therefore obtains a preferable result.

In the case of averaging circuit 405 that averages the amplitude value of the output signal, on the other hand, the fall coefficient is set small and the rise coefficient is set large, whereby the time constant of averaging becomes longer when the input signal is smaller than the output signal and the time constant of averaging becomes shorter when the input signal is greater than the output signal. In this way, the output signal of averaging circuit 405 tends to increase and tends not to decrease. The output of averaging circuit 405 is converted to a reciprocal by reciprocal circuit 406, and as a result, the envelope target value tends to decrease and tends not to increase to obtain a desirable result.

It will be clear that similar effects are obtained when an averaging circuit is used that has the same functions but that has a configuration other than shown in FIG. 13.

Seventh Embodiment

In each of the above-described embodiments, the envelope target value was controlled based on at least one of the input signal and output signal of the adaptive digital filter to suppress the range of fluctuation of filter coefficients. The envelope target value is applied as input to subtractor 307, and subtractor 307 subtracts the envelope target value from the absolute value of the output signal of the adaptive digital filter to generate error. Accordingly, error increases when the envelope target value is small and error decreases when the envelope target value is large, but an equivalent process can be realized by controlling the absolute value of the output signal. In other words, decreasing the envelope target value is equivalent to increasing the absolute value of the output signal to a similar degree and increasing the envelope target value is equivalent to decreasing the absolute value of the output signal to a similar degree. The present embodiment focuses on this point and controls the output of absolute value circuit 308 that is applied as input to subtractor 307 based on at least one of the input signal and output signal of the adaptive digital filter to suppress the range of fluctuation of filter coefficients.

Figure 14:
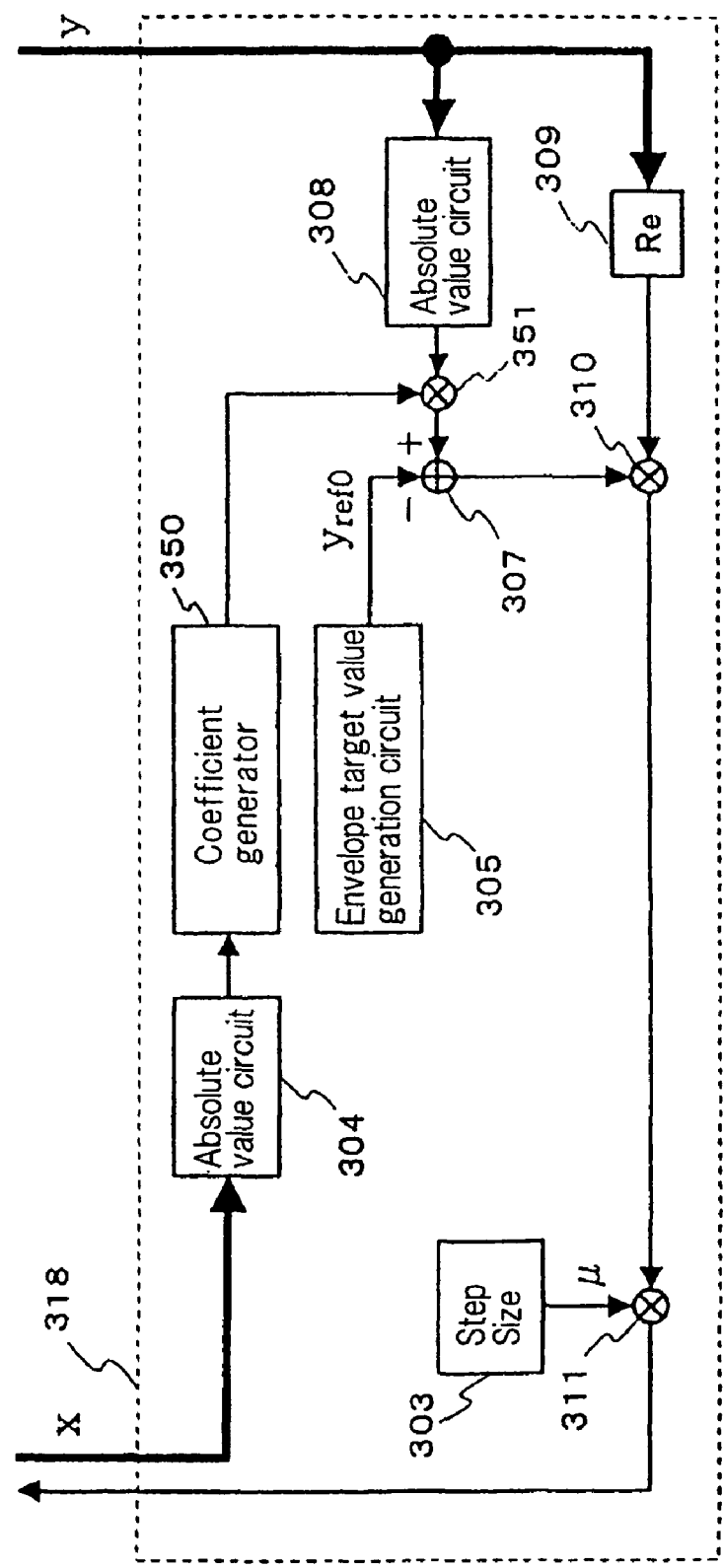
FIG. 14 is a block diagram of the principal components of the adaptive digital filter according to the seventh embodiment of the present invention.

Referring to FIG. 14, the adaptive digital filter according to the seventh embodiment of the present invention differs from the first embodiment in that the adaptive digital filter is provided with: coefficient generator 350 for supplying a coefficient that is substantially proportional to the reciprocal of the value obtained by averaging the amplitude value of the complex input signal that is supplied from absolute value circuit 304s, and multiplier 351 provided between absolute value circuit 308 and subtractor 307 for supplying subtractor 307 with the result obtained by multiplying the output of absolute value circuit 308 with the output of coefficient generator 350; and in that envelope target value generation circuit 305 is of a configuration for supplying a fixed envelope target value that is determined in advance.

Figure 15:
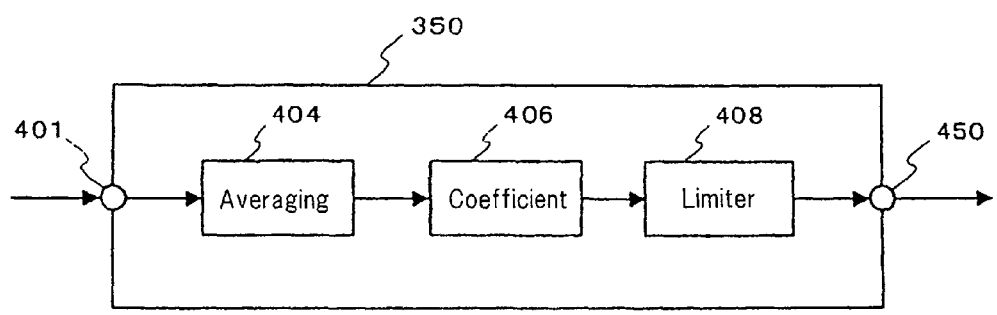
FIG. 15 is a block diagram of a working example of the coefficients generator used in the adaptive digital filter according to the seventh embodiment of the present invention.

Referring to FIG. 15, the working example of coefficient generator 350 is made up from: averaging circuit 404 for averaging the output of absolute value circuit 304 that is transmitted by way of input terminal 401; reciprocal circuit 406 for calculating the reciprocal of the output value of averaging circuit 404 and supplying the result as output; and limiter 408 for implementing control such that the output value of reciprocal circuit 406 falls between an upper limit and lower limit that have been determined in advance and supplying the result to multiplier 351 by way of output terminal 450.

In the first embodiment, when the amplitude value of the input signal of the adaptive digital filter was small, a small envelope target value was generated to increase the error that is the result of subtraction by subtractor 307. In contrast, the envelope target value is fixed in the present embodiment, and the error, which is the result of subtraction by subtractor 307, is increased by multiplying the output of absolute value circuit 308 by a large coefficient that is substantially proportional to the reciprocal of the amplitude value of the small input signal. On the other hand, in the first embodiment, a large envelope target value is generated to reduce the error that is the subtraction result of subtractor 307 when the amplitude value of the input signal of the adaptive digital filter is large, but in the present embodiment, the envelope target value is fixed, and the error that is the subtraction result of subtractor 307 is increased by multiplying the output of absolute value circuit 308 by a small coefficient that is substantially proportional to the reciprocal of the amplitude value of a large input signal. The present embodiment thus exhibits the same effect as the first embodiment.

As in the seventh embodiment, equivalent processing can be realized in the second to sixth embodiments by controlling the output of absolute value circuit 308 instead of controlling the envelope target value.

Figure 16:
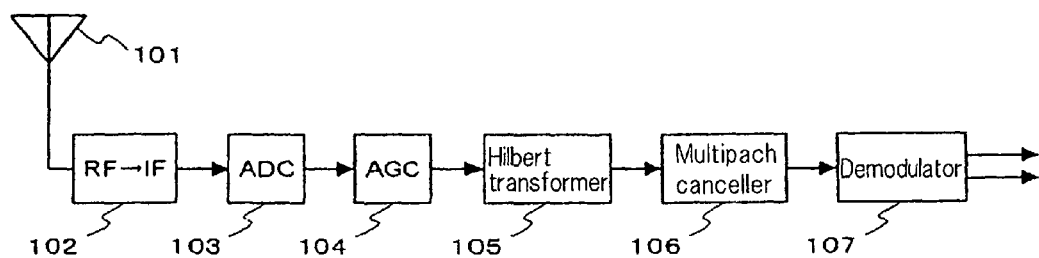
FIG. 16 is a block diagram of an FM receiver according to an embodiment of the present invention.

Explanation next regards an embodiment in which the adaptive digital filter of the present invention is applied in the multipath canceller of an FM receiver. Referring to FIG. 16, the FM receiver according to the present embodiment is made up from: antenna 101, radio frequency/intermediate frequency converter 102, analog/digital converter 103, automatic gain controller 104, Hilbert transformer 105, multipath canceller 106, and demodulator 107, an adaptive digital filter according to any of the above-described embodiments being used as multipath canceller 106.

An FM modulated wave received at antenna 101 is converted to a signal of the intermediate frequency band in radio frequency/intermediate frequency converter 102 and transmitted to analog/digital converter 103. Analog/digital converter 103 samples the analog signal transmitted from radio frequency/intermediate frequency converter 102 at a suitable sampling frequency to convert the analog signal to a digital signal and transmits the result to automatic gain controller 104. Automatic gain controller 104 transmits to Hilbert transformer 105 the result of multiplying gain such that the amplitude of the output signal falls within a fixed range that is within a range that does not adversely affect a CMA algorithm that takes the value of the envelope as an index.

If the gain of automatic gain controller 104 is here raised to increase the follow-up speed, the change of the envelope that is necessary for the CMA algorithm is suppressed, and the gain of automatic gain controller 104 is therefore lowered to delay the follow-up speed. Adopting this approach conventionally resulted in a drastic reduction of the amplitude of the input signal, which in turn caused overflow of filter coefficients, but control of the envelope target value in the present invention eliminates this problem.

In Hilbert transformer 105, the signal that is transmitted from automatic gain controller 104 is converted to an analytic signal, i.e., a complex signal in which one of two signals having phases shifted 90° from each other is a real part and the other signal is an imaginary part, and this result is transmitted to multipath canceller 106. Multipath canceller 106 receives as input the complex input signal transmitted from Hilbert transformer 105, converts this to a signal in which the effect of multiple reflections is reduced, and transmits the result to demodulator 107. Demodulator 107 carries out FM demodulation of the signal transmitted from multipath canceller 106 and supplies a signal in the speech frequency band. A complex output signal is supplied from output terminal 302 of the adaptive digital filter of each of the above-described embodiments, but only the real part may be extracted and supplied to demodulator 107, or only the imaginary part may be extracted, the code inverted, and the result then supplied to demodulator 107.

Although embodiments of the present invention have been described hereinabove, the present invention is not limited to the above-described embodiments and is open to various additions and modifications as will be described hereinbelow.

Although real-part extraction circuits $335_0$-$335_{N-1}$ and real-part extraction circuit 309 were used in the first to third embodiments, all or a portion of these circuits may be replaced by imaginary-part extraction/inversion circuits. An imaginary-part extraction/inversion circuit is a circuit for extracting only the imaginary part of a complex signal that is received as input and supplying as output a value in which the code of this signal is inverted. The complex input signal that is applied to input terminal 301 of the adaptive digital filter is a signal that has been made a complex signal in which one of two signals that are generated from one real signal and that have phases that differ from each other by 90° is a real part and the other signal is an imaginary part, and using an imaginary-part extraction/inversion circuit therefore has the same effect as the previously described first to third embodiments.

Although all filter coefficients are real numbers, i.e., scalar values in the first to third embodiments, a portion of the filter coefficients can be made complex numbers, although this form somewhat diminishes the effect of reducing the amount of operations. Alternatively, real-part extraction circuit 309 may be moved to the output-side of multiplier 310 or moved to the output-side of multiplier 311 and operations then carried out by complex numbers in multipliers 310 and 311.

Although an FIR filter was used as the filter unit in each of the above-described embodiments, an IIR filter can also be used.

Although an LMS algorithm was used as the adaptive algorithm in the above-described embodiments, the present invention allows the use of various other adaptive algorithms such as a Recursive Least Squares Algorithm, Least Squares Algorithm, an Affine Projection Algorithm, and a Gradient Algorithm. When the number of multiplications when updating filter coefficients by means of these adaptive algorithms is greater than for an LMS algorithm, the effect of reducing the amount of operations by converting filter coefficients to real numbers is further augmented.

Although the above-described embodiments focused on FM modulation, it will be clear that the configuration of the present invention can also be applied to other constant-amplitude modulation such as PSK (Phase Shift Keying). It will also be clear that the present invention can be applied to modulation modes such as QAM (Quadrature Amplitude Modulation) if multi-level CMA is used. In addition, of the constant-modulus algorithms shown in the document "Blind Equalization Using the Constant Modulus Criterion: A Review" by C. Richard Johnson, Jr., Philip Schniter, Thomas J. Endres, James D. Behm, Donald R. Brown, Raúl A. Casas (Proceedings of IEEE, Vol. 86, No. 10, October 1998), the present invention can clearly also be applied to algorithms in which the output signals are complex signals.

Although explanation has focused on CMA that takes the envelope as an index in each of the above-described embodiments, the present invention can clearly be applied to cases in which another statistic is taken as an index, as shown in the document "Blind Equalization Using the Constant Modulus Criterion: A Review" by C. Richard Johnson, Jr., Philip Schniter, Thomas J. Endres, James D. Behm, Donald R. Brown, Raúl A. Casas (Proceedings of IEEEE, Vol. 86, No. 10, October 1998).

The functions of the adaptive digital filter of the present invention can of course be realized by hardware through the use of individual components, ASIC (Application-Specific Integrated Circuits), or FPGA (Field Programmable Gate Arrays), and can also be realized by a computer such as a DPS (Digital Signal Processor) and a program. The program is provided by recording on a computer-readable recording medium such as a magnetic disk or semiconductor memory, is read to the computer at the time of start-up, and by controlling the operations of the computer, causes the computer to function as the adaptive digital filter in each of the above-described embodiments.

As described in the foregoing explanation, the adaptive digital filter according to the present invention is useful as an adaptive digital filter that uses a CMA algorithm and is particularly suitable for use in the multipath equalizer of an FM receiver.

What is claimed is:

1. An adaptive digital filter comprising:
   a filter unit for generating an output signal by means of a convolution operation of an input signal and filter coefficients and supplying the result as output signal; and
   a coefficient control unit for controlling said filter coefficients based on error between a target signal and an index value derived from said output signal, and further, for controlling said target signal based on at least one of said input signal and said output signal to suppress the range of fluctuation of said filter coefficients;
   wherein said filter unit takes the input signal that is a complex signal in which one of two signals that are generated from one real signal and that have phases shifted 90° from each other is a real part and the other signal is an imaginary part, generating the output signal that is a complex signal by means of a convolution operation of the input signal and filter coefficients that are real signals, and supplying the result as output signal, and
   wherein said coefficient control unit comprises:
      an envelope target value generation circuit for controlling said target signal based on an amplitude of said output signal, decreases said target signal when the amplitude of said output signal is increasing, increases said target signal when the amplitude of said output signal is decreasing, and moreover, makes the speed of decreasing said target signal greater than the speed of increasing said target signal.

2. A Frequency Modulation (FM) receiver that uses an adaptive digital filter, said FM receiver being provided with a Hilbert transformer for applying to said adaptive digital filter a complex signal generated by subjecting an FM modulated signal, which has been converted to an intermediate frequency and digitized, to a Hilbert transform, wherein said adaptive digital filter comprises:
   a filter unit for generating an output signal by means of a convolution operation of an input signal and filter coefficients and supplying the result as output signal; and
   a coefficient control unit for controlling said filter coefficients based on error between a target signal and an index value derived from said output signal, and further, for controlling said target signal based on at least one of said input signal and said output signal to suppress the range of fluctuation of said filter coefficients;
   wherein said filter unit takes the input signal that is a complex signal in which one of two signals that are generated from one real signal and that have phases shifted 90° from each other is a real part and the other signal is an imaginary part, generating an output signal that is a complex signal by means of a convolution operation of the input signal and filter coefficients that are real signals, and supplying the result as output signal, and
   wherein said coefficient control unit comprises:
      an envelope target value generation circuit for controlling said target signal based on an amplitude of said output signal, decreases said target signal when the amplitude of said output signal is increasing, increases said target signal when the amplitude of said output signal is decreasing, and moreover, makes the speed of decreasing said target signal greater than the speed of increasing said target signal.

3. An adaptive digital filter comprising:
   a filter unit for generating an output signal by means of a convolution operation of an input signal and filter coefficients and supplying the result as output signal; and
   a coefficient control unit for controlling said filter coefficients based on error between a target signal and an index value derived from said output signal, and further, for controlling said target signal based on at least one of said input signal and said output signal to suppress the range of fluctuation of said filter coefficients;
   wherein said coefficient control unit comprises:
      an envelope target value generation circuit for controlling said target signal based on an amplitude of said output signal, decreases said target signal when the amplitude of said output signal is increasing, increases said target signal when the amplitude of said output signal is decreasing, and moreover, makes the speed of decreasing said target signal greater than the speed of increasing said target signal.

4. The adaptive digital filter according to claim 3, wherein said coefficient control unit takes the value of the envelope of said output signal as said index value.

5. A Frequency Modulation (FM) receiver that uses an adaptive digital filter, said FM receiver being provided with a Hilbert transformer for applying to said adaptive digital filter a complex signal generated by subjecting an FM modulated signal, which has been converted to an intermediate frequency and digitized, to a Hilbert transform, wherein said adaptive digital filter comprises:
   a filter unit for generating an output signal by means of a convolution operation of an input signal and filter coefficients and supplying the result as output signal; and
   a coefficient control unit for controlling said filter coefficients based on error between a target signal and an index value derived from said output signal, and further, for controlling said target signal based on at least one of said input signal and said output signal to suppress the range of fluctuation of said filter coefficients;
   wherein said coefficient control unit comprises:
      an envelope target value generation circuit for controlling said target signal based on an amplitude of said output signal, decreases said target signal when the amplitude of said output signal is increasing, increases said target signal when the amplitude of said output signal is decreasing, and moreover, makes the speed of decreasing said target signal greater than the speed of increasing said target signal.

6. A signal processing method comprising:
   a first step of generating an output signal by a convolution operation of an input signal and filter coefficients and supplying the result as output signal; and
   a second step of controlling said filter coefficients based on error between a target signal and an index value derived from said output signal, and further, controlling said target signal based on at least one of said input signal and said output signal to suppress the range of fluctuation of said filter coefficients;

wherein said first step takes the input signal that is a complex signal in which one of two signals that are generated from one real signal and that have phases shifted 90° from each other is a real part and the other signal is an imaginary part, generating an output signal that is a complex signal by means of a convolution operation of the input signal and filter coefficients that are real signals, and supplying the result as output signal, and wherein, in said second step, when controlling said target signal based on an amplitude of said output signal, decreases said target signal when the amplitude of said output signal is increasing, increases said target signal when the amplitude of said output signal is decreasing, and moreover, making the speed of decreasing said target signal is made greater than the speed of increasing said target signal.

7. A signal processing method comprising:
a first step of generating an output signal by a convolution operation of an input signal and filter coefficients and supplying the result as output signal; and
a second step of controlling said filter coefficients based on error between a target signal and an index value derived from said output signal, and further, controlling said target signal based on at least one of said input signal and said output signal to suppress the range of fluctuation of said filter coefficients;
wherein, in said second step, when controlling said target signal based on an amplitude of said output signal, said target signal is decreased when the amplitude of said output signal is increasing, said target signal is increased when the amplitude of said output signal is decreasing, and further, the speed of decreasing said target signal is made greater than the speed of increasing said target signal.

8. The signal processing method according to claim 6, wherein, in said second step, the value of the envelope of said output signal is taken as said index value.

9. The signal processing method according to claim 8, wherein said second step includes:
a common process of controlling said target signal, generating a error signal that accords with error between said target signal and the value of the envelope of said output signal, and supplying the result as output; and
a plurality of separate processes provided for each multiplier for said convolution operations for calculating filter coefficients to be used in a next sampling cycle based on:
the error signal applied as input to a corresponding multiplier, said error supplied as output from said common process, and a current filter coefficient.

* * * * *